United States Patent
Bower

(10) Patent No.: US 9,899,329 B2
(45) Date of Patent: Feb. 20, 2018

(54) INTERCONNECTION STRUCTURES AND METHODS FOR TRANSFER-PRINTED INTEGRATED CIRCUIT ELEMENTS WITH IMPROVED INTERCONNECTION ALIGNMENT TOLERANCE

(75) Inventor: Christopher Bower, Raleigh, NC (US)

(73) Assignee: X-Celeprint Limited, Lee Maltings, Dyke Parade, Cork (IE)

( * ) Notice: Subject to any disclaimer, the term of this patent is extended or adjusted under 35 U.S.C. 154(b) by 752 days.

(21) Appl. No.: 13/302,497

(22) Filed: Nov. 22, 2011

(65) Prior Publication Data
US 2012/0126229 A1 May 24, 2012

Related U.S. Application Data

(60) Provisional application No. 61/416,527, filed on Nov. 23, 2010.

(51) Int. Cl.
*H01L 23/538* (2006.01)
*H01L 21/683* (2006.01)
(Continued)

(52) U.S. Cl.
CPC ...... *H01L 23/5389* (2013.01); *H01L 21/6835* (2013.01); *H01L 24/19* (2013.01);
(Continued)

(58) Field of Classification Search
CPC ......... H01L 21/58; H01L 21/70; H01L 25/00; H01L 25/50; H01L 2021/50; H01L 21/67;
(Continued)

(56) References Cited

U.S. PATENT DOCUMENTS 6,392,292 B1 * 5/2002 Morishita .................. 257/686
6,969,624 B2 11/2005 Iwafuchi et al.
(Continued)

FOREIGN PATENT DOCUMENTS

JP    11-142878 A    5/1999

OTHER PUBLICATIONS

Chesterfield, Reid J. et al., "63.3: Multinozzle Printing: A Cost-effective Process for OLED Display Fabrication", SID 2009 Digest, pp. 951-954.
(Continued)

*Primary Examiner* — Davienne Monbleau
*Assistant Examiner* — Leslie Pilar Cruz
(74) *Attorney, Agent, or Firm* — William R. Haulbrook; Alexander D. Augst; Choate, Hall & Stewart LLP

(57) ABSTRACT

An electronic component array includes a backplane substrate, and a plurality of integrated circuit elements on the backplane substrate. Each of the integrated circuit elements includes a chiplet substrate having a connection pad and a conductor element on a surface thereof. The connection pad and the conductor element are electrically separated by an insulating layer that exposes at least a portion of the connection pad. At least one of the integrated circuit elements is misaligned on the backplane substrate relative to a desired position thereon. A plurality of conductive wires are provided on the backplane substrate including the integrated circuit elements thereon, and the connection pad of each of the integrated circuit elements is electrically connected to a respective one of the conductive wires notwithstanding the misalignment of the at least one of the integrated circuit elements. Related fabrication methods are also discussed.

16 Claims, 19 Drawing Sheets

(51) Int. Cl.
  *H01L 23/00* (2006.01)
  *H01L 21/66* (2006.01)
(52) U.S. Cl.
  CPC .............. *H01L 24/20* (2013.01); *H01L 24/24* (2013.01); *H01L 24/82* (2013.01); *H01L 24/83* (2013.01); *H01L 22/32* (2013.01); *H01L 2221/68368* (2013.01); *H01L 2221/68372* (2013.01); *H01L 2224/21* (2013.01); *H01L 2224/2101* (2013.01); *H01L 2224/211* (2013.01); *H01L 2224/214* (2013.01); *H01L 2224/2105* (2013.01); *H01L 2224/244* (2013.01); *H01L 2224/2405* (2013.01); *H01L 2224/24011* (2013.01); *H01L 2224/24101* (2013.01); *H01L 2224/24137* (2013.01); *H01L 2224/76155* (2013.01); *H01L 2224/82102* (2013.01); *H01L 2224/82106* (2013.01); *H01L 2924/01005* (2013.01); *H01L 2924/01006* (2013.01); *H01L 2924/01013* (2013.01); *H01L 2924/01023* (2013.01); *H01L 2924/01033* (2013.01); *H01L 2924/01047* (2013.01); *H01L 2924/01074* (2013.01); *H01L 2924/01082* (2013.01); *H01L 2924/10329* (2013.01); *H01L 2924/12044* (2013.01); *H01L 2924/14* (2013.01); *H01L 2924/15788* (2013.01)

(58) Field of Classification Search
  CPC ............... H01L 23/538; H01L 23/5382; H01L 23/5383; H01L 23/5387; H01L 24/03; H01L 24/04; H01L 24/27; H01L 24/28; H01L 24/29; H01L 2224/8012
  USPC ........ 438/107, 110, 112, 126; 257/685, 723, 257/E21.532, E21.705
  See application file for complete search history.

(56) References Cited

U.S. PATENT DOCUMENTS

| 7,127,810 | B2 | 10/2006 | Kasuga et al. | |
|---|---|---|---|---|
| 2005/0116324 | A1* | 6/2005 | Yamaguchi | 257/678 |
| 2007/0235849 | A1* | 10/2007 | Othieno et al. | 257/678 |
| 2008/0224254 | A1 | 9/2008 | Couillard et al. | |
| 2012/0009738 | A1* | 1/2012 | Crawford | H01L 21/6835 438/121 |

OTHER PUBLICATIONS

Hamer, John et al., "63.2: AMOLED Displays using Transfer-Printed Integrated Circuits", SID 2009 Digest, pp. 947-950.

* cited by examiner

INTERCONNECTION STRUCTURES AND METHODS FOR TRANSFER-PRINTED INTEGRATED CIRCUIT ELEMENTS WITH IMPROVED INTERCONNECTION ALIGNMENT TOLERANCE

CLAIM OF PRIORITY

This application claims priority under 35 U.S.C. § 119(e) from U.S. Provisional Patent Application Ser. No. 61/416,527 entitled "Interconnection Structure and Method for Transfer-Printed Integrated Circuits," filed with the United States Patent and Trademark Office on Nov. 23, 2010, the disclosure of which is incorporated by reference herein in its entirety.

FIELD OF THE INVENTION

The present invention relates to integrated circuit device fabrication, and more particularly, to apparatus and methods for assembling integrated circuit elements on a substrate.

BACKGROUND OF THE INVENTION

Large substrates with electronically active components distributed over the extent of the substrate are used in a variety of electronic systems, for example imaging devices such as flat-panel liquid crystal or OLED display devices and in digital radiographic plates. Large substrates with electrically active components are also found in flat-panel solar cells.

The electronically active components on flat-panel substrates are typically formed by sputtering a layer of inorganic semiconductor material or by spin-coating a layer of organic semiconductor material over the entire substrate and processing the layer to form electronic components. However, such coatings typically may have relatively poor electronic characteristics. Inorganic semiconductor materials can be processed to improve their electronic characteristics; for example, amorphous silicon can be heat-treated to form polycrystalline silicon. In other processes, microcrystalline semiconductor layers can be formed by using an underlying seeding layer. These methods typically improve the electron mobility of the semiconductor, but the performance of the resulting layer may still be worse than is often desired or needed.

The substrate and layer of semiconductor material can be photo-lithographically processed to define electronically active components, such as transistors. Such transistors are known as thin-film transistors (TFTs) since they are formed in a thin layer of semiconductor material, typically silicon. The photo-lithographic processing typically requires high-resolution mask steps to pattern the semiconductor materials and metal interconnections on the substrate. In these devices, the substrate is often made of glass, for example, Corning Eagle® or Jade® glass designed for display applications.

However, these conventional thin-film techniques may have limitations. Despite processing methods used to improve the performance of thin-film transistors, such transistors may have a performance lower than the performance of conventional integrated circuits formed in mono-crystalline semiconductor material. Also, semiconductor material and active components may be used on only portions of the substrate, leading to wasted material and increased material and processing costs. The substrate materials may be limited by the processing steps that may be necessary to process the semiconductor material, as well as the photo-lithographic steps used to pattern the active components. For example, plastic substrates have a limited chemical and heat tolerance and typically do not readily survive photo-lithographic processing. Furthermore, the manufacturing equipment used to process large substrates with thin-film circuitry may require relatively high resolution and may be expensive.

In another manufacturing technique, a mono-crystalline semiconductor wafer may be employed as the substrate. While this approach can provide substrates with similar performance as integrated circuits, the size of such substrates may be limited, for example, to a 12-inch diameter circle, and the wafers are relatively expensive compared to other substrate materials such as glass or polymer.

In yet another approach, thin layers of semiconductor may be bonded to a substrate and then processed. Such a method is known as semiconductor-on-glass or silicon-on-glass (SOG) and is described, for example, in U.S. Patent Application Publication No. 2008/0224254, published Sep. 18, 2008. If the semiconductor material is crystalline, high-performance thin-film circuits can be obtained. However, the bonding technique can be expensive and the high-resolution processing equipment needed to form thin-film active components on large substrates may be expensive.

It is also known to provide relatively large integrated circuits in surface mountable packages that are directly adhered to a substrate. However, these integrated circuits are relatively large and additional layers may not be easily formed over the integrated circuits. Furthermore, electrical inter-connections to the surface-mountable package may require high-resolution patterning.

Publication number 11-142878 of the Patent Abstracts of Japan entitled "Formation of Display Transistor Array Panel" describes etching a substrate to remove it from a thin-film transistor array on which the TFT array was formed. TFT circuits formed on a first substrate can be transferred to a second substrate by adhering the first substrate and the TFTs to the surface of the second substrate and then etching away the first substrate, leaving the TFTs bonded to the second substrate. This method typically requires etching a significant quantity of material and risks damaging the exposed TFT array. Also, as with the other techniques discussed above, the patterned processing may require expensive, high-resolution equipment.

Another method of locating material on a substrate is described in U.S. Pat. No. 7,127,810. In this method, a first substrate carries a thin-film object to be transferred to a second substrate. An adhesive is applied to the object to be transferred or to the second substrate in the desired location of the object. The substrates are aligned and brought into contact. A laser beam irradiates the object to abrade the transferring thin film so that the transferring thin film adheres to the second substrate. The first and second substrates are separated, peeling the film in the abraded areas from the first substrate and transferring it to the second substrate. In one embodiment, a plurality of objects may be selectively transferred by employing a plurality of laser beams to abrade selected areas. Objects to be transferred can include thin-film circuits. Further processing, for example to provide electrical interconnections between the transferred objects, may require high-resolution processing.

U.S. Pat. No. 6,969,624 describes a method of transferring a device from a first substrate onto a holding substrate by selectively irradiating an interface with an energy beam. The interface is located between a device for transfer and the first substrate and includes a material that generates ablation upon irradiation, thereby releasing the device from the substrate. For example, a light-emitting device (LED) can be made of a nitride semiconductor on a sapphire substrate. The energy beam is directed to the interface between the sapphire substrate and the LED nitride semiconductor releasing the LED and allowing the LED to adhere to a holding substrate coated with an adhesive. The adhesive is then cured. These methods, however, may require the patterned deposition of adhesive on the object(s) or on the second substrate. Moreover, the laser beam that irradiates the object may be shaped to match the shape of the object and the laser abrasion can damage the object to be transferred. Furthermore, the adhesive cure takes time, which may reduce the throughput of the manufacturing system. Further processing, for example to provide electrical interconnections between the transferred objects, may also require high-resolution processing.

In another method for transferring active components from one substrate to another, described in "AMOLED Displays using Transfer-Printed Integrated Circuits" published in the Proceedings of the 2009 Society for Information Display International Symposium Jun. 2-5, 2009, in San Antonio, Tex., US, vol. 40, Book 2, ISSN 0009-0966X, paper 63.2 p. 947, small integrated circuits (chiplets) with connection pads formed on the chiplet surface are formed in a wafer and released from the wafer by etching beneath the circuits. A PDMS stamp is pressed against the wafer and the circuits adhered to the stamp. The circuits are then pressed against a substrate coated with an adhesive, adhered to the substrate, and the adhesive is subsequently cured. Subsequent photo-lithographic processes are used to form electrical wires over the substrate and on to the connection pads. However, the position and orientation of the chiplets resulting from the printing process can vary somewhat. Thus, the connection pads may need to be relatively large so that the wires formed by the photo-lithographic processing steps contact the contact pads. The relatively large connection pads can reduce the space available for circuits and circuit connections, and thus can reduce the functionality of the chiplets.

SUMMARY OF THE INVENTION

According to some embodiments of the present invention, integrated circuit elements are provided on a receiving substrate. Each of the integrated circuit elements includes a chiplet substrate having a connection pad and a conductor element on a surface thereof, where the connection pad and the conductor element are electrically separated. At least one of the integrated circuit elements is misaligned on the receiving substrate relative to a desired position thereon such that the at least one of the integrated circuit elements is positioned on the receiving substrate at a distance from the desired position that is greater than or equal to a distance between the conductor element and the connection pad. A conductive layer is formed on the receiving substrate including the integrated circuit elements thereon such that the connection pad of each of the integrated circuit elements is electrically connected to the conductive layer.

In some embodiments, each of the integrated circuit elements may include an insulating layer on the chiplet substrate that exposes at least a portion of the connection pad to the conductive layer and covers the conductor element on the surface of each chiplet substrate to electrically separate or isolate the conductor element from the conductive layer.

In some embodiments, a planarization layer may be formed on the receiving substrate including the integrated circuit elements thereon. The planarization layer may include via openings therein, where respective positions of the via openings in the planarization layer may be based on respective desired positions of the integrated circuit elements on the receiving substrate. The conductive layer may be formed on the planarization layer and in the via openings to electrically contact the connection pad of each of the integrated circuit elements.

In some embodiments, at least one of the via openings has a diameter or other dimension sufficient to expose a portion of the connection pad and a portion of the insulating layer covering the conductor element of the at least one of the integrated circuit elements that is misaligned on the receiving substrate. For example, the dimension of the at least one of the via openings may be greater than the distance between the conductor element and the connection pad on the surface of the chiplet substrate.

In some embodiments, the connection pad of each of the integrated circuit elements may be coupled to an active element therein such that the conductive layer provides an electrical connection between respective active elements of each chiplet substrate, and the conductor element of each of the integrated circuit elements may provide an electrical connection between respective active elements of a same chiplet substrate.

In some embodiments, each chiplet substrate may include a plurality of connection pads and a plurality of conductor elements, and at least one of the conductor elements may be provided between adjacent ones of the connection pads on the surface of each chiplet substrate.

In some embodiments, the integrated circuit elements including a plurality of active elements therein may be formed on a source substrate. The integrated circuit elements may be transferred from the source substrate to the receiving substrate such that the at least one of the integrated circuit elements is misaligned on the receiving substrate relative to the desired position.

In some embodiments, the source substrate may include a sacrificial layer thereon between the integrated circuit elements and the source substrate. The integrated circuit elements may be transferred by separating the integrated circuit elements from one another on the source substrate to define tethers attaching the integrated circuit elements to respective anchor areas on the source substrate, and etching the sacrificial layer to release the integrated circuit elements from the source substrate without releasing the anchor areas therefrom.

In some embodiments, the integrated circuit elements may be transferred by pressing a stamp against the source substrate to break the tethers attaching the integrated circuit elements to the respective anchor areas, retracting the stamp from the source substrate such that the integrated circuit elements are adhered to the stamp, pressing the stamp including the integrated circuit elements thereon against the receiving substrate, and retracting the stamp from the receiving substrate to delaminate the integrated circuit elements therefrom and such that the at least one of the integrated circuit elements is misaligned on the receiving substrate relative to the desired position.

In some embodiments, a protective layer may be formed on the integrated circuit elements prior to separating and/or etching. The protective layer may include a silicon dioxide layer and an amorphous silicon layer thereon.

According to further embodiments of the present invention, an electronic component array includes a backplane substrate, and a plurality of integrated circuit elements on the backplane substrate. Each of the integrated circuit elements includes a chiplet substrate having a connection pad and a conductor element on a surface thereof. The connection pad and the conductor element are electrically separated by an insulating layer that exposes at least a portion of the connection pad. At least one of the integrated circuit elements is misaligned on the backplane substrate relative to a desired position thereon at a distance from the desired position that is greater than or equal to a distance between the conductor element and the connection pad. A plurality of conductive wires are provided on the backplane substrate including the integrated circuit elements thereon, and the connection pad of each of the integrated circuit elements is electrically connected to a respective one of the conductive wires.

In some embodiments, a planarization layer including via openings therein may be provided on the backplane substrate including the integrated circuit elements thereon. The conductive wires may respectively extend into the corresponding via openings to electrically contact the connection pad of each of the integrated circuit elements.

In some embodiments, respective positions of the via openings in the planarization layer may be based on respective desired positions of the integrated circuit elements on the backplane substrate. At least one of the via openings may expose a portion of the connection pad and a portion of the insulating layer covering the conductor element of the at least one of the integrated circuit element that is misaligned on the receiving substrate.

In some embodiments, the exposed portion of the connection pad may be smaller than a dimension of the at least one via opening.

In some embodiments, an adhesive layer may be provided between each of the chiplet substrates and the backplane substrate. The adhesive layer adheres each of the chiplet substrates to the backplane substrate.

In some embodiments, the connection pad of each of the integrated circuit elements may be coupled to an active element therein, and the conductive wires may provide an electrical connection between respective active elements of each chiplet substrate. Also, in some embodiments, the conductor element of each of the integrated circuit elements may provide an electrical connection between respective active elements of a same chiplet substrate.

In some embodiments, each chiplet substrate may include a plurality of connection pads and a plurality of conductor elements on the surface thereof. At least one of the conductor elements may be provided between adjacent ones of the connection pads on the surface of each chiplet substrate.

In some embodiments, the integrated circuit elements may be transfer-printed elements.

In some embodiments, the conductor element and the connection pad on each chiplet substrate may be portions of a same metal layer.

According to still further embodiments of the present invention, a substrate for printing transferrable integrated circuit chiplets includes a patterned sacrificial layer on the substrate, and a plurality of integrated circuit chiplets on the patterned sacrificial layer. Each of the integrated circuit chiplets includes a separate chiplet substrate detached from the substrate by a pattern of the sacrificial layer, active elements on or in the chiplet substrate, a connection pad on a surface of the chiplet substrate, chiplet wires on or in the chiplet substrate electrically connecting the active elements and the connection pad, a conductor electrically separate from the connection pad on the surface of the chiplet substrate, where the conductor is electrically connected to a chiplet wire or one of the active elements, and an insulating layer on the chiplet substrate and the conductor, where the insulating layer leaves at least a portion of the connection pad exposed.

In some embodiments, one or more test pads, a plurality of electrically conductive tethers, and anchors may be provided on the substrate. Each anchor may be located over and in contact with the patterned sacrificial layer and having a tether connecting the anchor to one of the integrated circuit chiplets. The tether may electrically connect active elements in the one of the integrated circuit chiplets to one or more exposed electrical test pads in the anchor.

According to yet further embodiments of the present invention, a method of fabricating transferrable integrated circuit chiplets includes providing a substrate, forming a sacrificial layer on the substrate, forming a chiplet substrate layer on the sacrificial layer, forming active elements on or in the chiplet substrate layer, forming a connection pad on a surface of the chiplet substrate layer, forming chiplet wires on or in the chiplet substrate electrically connecting the active elements and the connection pad, forming a conductor electrically separate from the connection pad on the surface of the chiplet substrate layer, where the conductor is electrically connected to a chiplet wire or active element, forming an insulating layer over the chiplet substrate and the conductor, leaving at least a portion of the connection pad exposed, and patterning the chiplet substrate layer and the sacrificial layer to form separate chiplet substrates detached from the substrate.

In some embodiments, a protective layer may be formed on the insulating layer and the connection pad. The protective layer may be a bi-layer, and each layer of the bi-layer may include a different material. For example, the protective bi-layer may include a silicon dioxide layer and an amorphous silicon layer.

According to yet other embodiments of the present invention, a backplane includes a backplane substrate and a plurality of integrated circuits located on the backplane substrate. Each integrated circuit includes a separate chiplet substrate having a surface, active elements formed on or in the chiplet substrate, a connection pad formed on the surface of the chiplet substrate, chiplet wires formed on or in the chiplet substrate electrically connecting the active elements and the connection pad, a conductor electrically separate from the connection pad formed on the surface of the chiplet substrate, the conductor electrically connected to a chiplet wire or active element, and an insulating layer formed over the chiplet substrate and the conductor, leaving at least a portion of the connection pad exposed. Electrically conductive wires are formed in a single layer over the backplane substrate, where the connection pad of each of the plurality of integrated circuits is connected to an electrically conductive wire.

According to still yet other embodiments of the present invention, a method of making a backplane having integrated circuits includes providing a backplane substrate, and providing a plurality of integrated circuits located on the backplane substrate. Each integrated circuit includes a separate chiplet substrate having a surface, active elements formed on or in the chiplet substrate, a connection pad formed on the surface of the chiplet substrate, chiplet wires formed on or in the chiplet substrate electrically connecting the active elements and the connection pad, a conductor electrically separate from the connection pad formed on the surface of the chiplet substrate and electrically connected to a chiplet wire or active element, and an insulating layer formed over the chiplet substrate and the conductor, leaving at least a portion of the connection pad exposed. The integrated circuits are located on the backplane substrate, and electrically conductive wires are formed in a single layer over the backplane substrate. The connection pad of each of the plurality of integrated circuits is connected to an electrically conductive wire.

Other methods and/or devices according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

Embodiments of the present invention provide advantages such as improved electrical performance and density in integrated circuits transfer-printed over large substrates. Embodiments of the invention also reduce the number of large-area photolithographic steps, reduce alignment tolerance requirements, and are compatible with wafer testing and a high-yield release process for the transfer-printed integrated circuits.

Figure 1A:
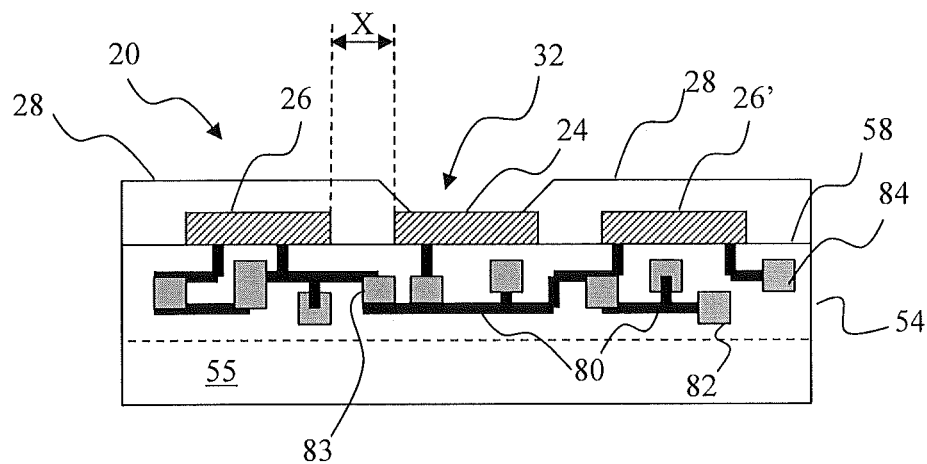
FIG. 1A is a cross section illustrating an integrated circuit according to some embodiments of the present invention.

The figures are not drawn to scale since the individual elements of the drawings have too great a size variation to permit depiction to scale.

DETAILED DESCRIPTION OF EMBODIMENTS OF THE INVENTION

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entireties.

Some embodiments of the present invention may be used in the fabrication of advanced display backplanes, for example, by assembling thousands of tiny integrated circuits onto glass substrates using transfer-printing. In particular, once circuits are printed onto a backplane or other target substrate, it may be necessary to form electrical interconnections. However, while the printing process may provide a high degree of accuracy, the chips may still be misplaced or misaligned on the order of 2-3 microns. Thus, interconnection processes may need to take such possible misalignment into consideration.

One interconnection approach towards addressing such misalignment is to form contact pads in the circuits that are large enough to account for both the transfer-printing accuracy and also the misalignment and size of the via to be formed down to the metal pad. In practice, such metal contact pads were relatively large, typically about 20 microns×20 microns in size.

In some embodiments of the present invention, a smaller contact pad can be formed in the circuit, for example, about 5 micrometers (μm)×5 μm, with a comparatively small via, for example, about 2 μm×2 μm, formed above the metal contact. As described in greater detail below, this process may be performed during the fabrication of the integrated circuit wafer, so the related design rules may be of reduced importance. Using the integrated-circuit vias according to some embodiments, the metal contact pad is reduced in size, and thus the design rules for the interconnection via to be formed on the large target substrate may be relaxed. Embodiments of the present invention may therefore provide improved electrical performance, fewer large-area photolithographic steps, improved yields, improved testability, increased density, and improved alignment tolerances for electrical circuit devices transferred from a source substrate to a destination substrate.

Referring to FIG. 1A, an integrated circuit according to embodiments of the present invention comprises a chiplet substrate 55 having a surface 58. Active elements 82, 83, 84 are formed on or in the chiplet substrate 55. The chiplet substrate 55 can include an active layer 54 in which the active elements 82, 83, 84 can be formed. The active layer 54 can include the entire chiplet substrate 55 or only a portion of the chiplet substrate 55 and can be doped or patterned to form the active elements 82, 83, 84. The active elements 82, 83, 84 can be integrated circuit elements. A connection pad 24 is formed on the surface 58 of the chiplet substrate 55. Chiplet wires 80 electrically connect the active elements 82, 83, 84 and the connection pad 24. Conductor elements 26, 26' that are electrically separate from the connection pad 24 are formed on the surface 58 of the chiplet substrate 55. The conductors 26, 26' are spatially separated by a distance X from the connection pad 24. The conductors 26, 26' are electrically connected to a chiplet wire 80 or active element 82, 83, 84. An insulating layer 28 is formed over the surface 58 of the chiplet substrate 55 and over the conductor 26, 26' leaving at least a portion of the connection pad 24 exposed, for example through the chiplet via 32 formed in the insulating layer 28. The connection pad 24 can be partially covered by the insulating layer 28. The integrated circuit can be a chiplet 20. As described herein, a "chiplet" may refer to a small integrated circuit that can be transferred to a backplane substrate 10 using a stamp as described below.

Figure 1B:
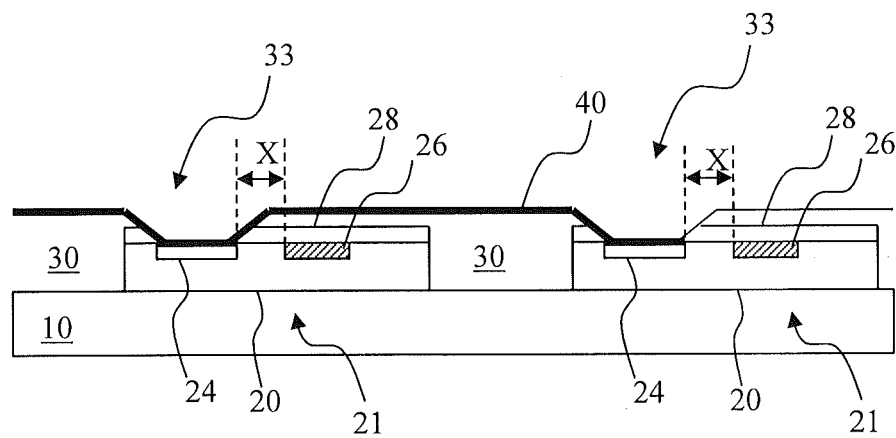
FIG. 1B is a cross section illustrating a backplane arrangement including integrated circuits thereon according to some embodiments of the present invention.

Referring to FIG. 1B, in some embodiments of the present invention, two chiplets 20 are located on the backplane 10 in desired design locations 21 and are covered with a planarization layer 30. Backplane vias 33 are formed in the planarization layer 30 in alignment with the connection pads 24 of the chiplets 20. Backplane wires 40 are formed in a single layer over the backplane 10 and insulating layer 28 and contact the connection pads 24 on the chiplets 20. Backplane vias 33 and backplane wires 40 are typically formed in separate masking steps from the location of the chiplets 20 and should be closely aligned with the chiplets 20 to ensure good electrical connections between the connection pads 24 and backplane wires 40. In a practical system, however, it can be difficult to align the chiplets 20 with the backplane 10 and the backplane masks used to form backplane vias 33 and backplane wires 40.

Figure 1C:
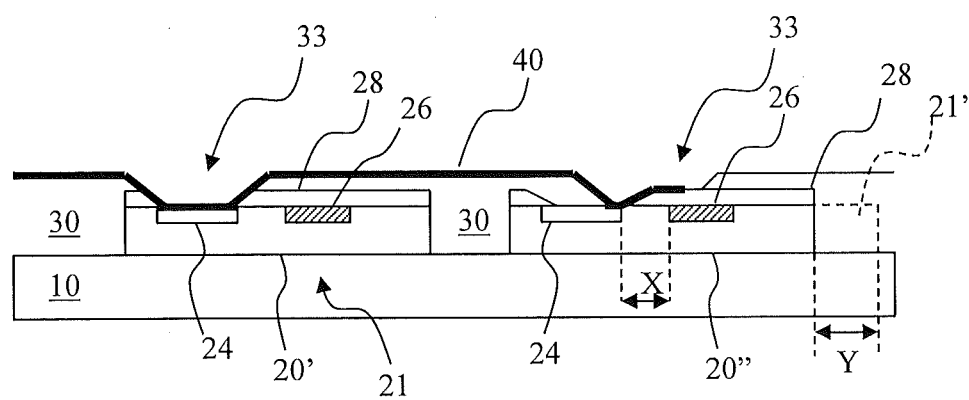
FIG. 1C is a cross section illustrating a backplane having integrated circuits according to some embodiments of the present invention.

Referring to FIG. 1C, in some embodiments of the present invention, two chiplets 20', 20" are located on the backplane 10 and are covered with a planarization layer 30. The chiplet 20' is located in the design location 21 while, because of manufacturing tolerances, the chiplet 20" is mis-located or misaligned on the backplane 10 by a distance X (e.g., the same distance that is between the connection pad 24 and the conductor 26) away from the desired design location 21'. A backplane via 33 is formed in the planarization layer 30 in alignment with the connection pads 24 of the chiplets 20 according to the desired design location 21 thereof. The backplane via 33 may define an opening that is wider than the distance X between the connection pad 24 and the conductor 26. Backplane wires 40 are formed in a single layer over the backplane 10 and insulating layer 28 and contact the connection pads 24 on the chiplets 20. In this example, the exposed portion of the connection pad 24 is smaller than the area of the backplane via 33 in plan view. Because the chiplet 20″ is misaligned or otherwise not properly located relative to the desired design location 21′ on the backplane 10, the backplane via 33 is not well aligned with the connection pad 24 on the chiplet 20″, which is spaced a distance Y from the desired design location 21′ (where Y is greater than or equal to X). However, since the insulating layer 28 insulates the backplane wires 40 from the conductors 26, the backplane wires 40 still provide a connection to the connection pads 24 and not to the conductors 26.

The chiplet substrate 55 can be a semiconductor layer, for example silicon, GaAs, and/or other III-V compound semiconductors. The chiplet substrate 55 can be crystalline, amorphous, polycrystalline, or microcrystalline and can have multiple patterned or unpatterned layers of different materials, including electrically insulating layers such as some oxides and nitrides, e.g. silicon dioxide and silicon nitride. The active layer 54 can be a doped semiconductor or otherwise be processed to enable the formation of active elements 82, 83, 84. The active elements 82, 83, 84 can include electrical elements such as transistors, capacitors, resistors, and/or wires or electro-optical elements such as photo-sensors and/or light-emitting diodes, or both. The term "integrated circuit" may refer to a substrate that has been processed to form circuits integrated into a substrate, for example by photo-lithographic processes, to form optical, electrical, or electro-optic circuits that transform, process, and/or conduct electrical or optical energy. A "chiplet" can refer to a small integrated circuit, for example an integrated circuit that may be too small to be packaged and used in an electrical circuit using conventional pick-and place, surface mount, or flip-chip methods. For example, chiplets as described herein can have substrates that are 5-10 microns thick, 10-20 microns thick, 20-50 microns thick, or 50-100 microns thick. Chiplets can be 10-100 microns wide and 20-500 microns long, for example. The chiplets can have different sizes or areas, for example, 1000 square microns or 10,000 square microns, 100,000 square microns, or 1 square mm, or larger, and can have variable aspect ratios, for example 2:1, 5:1, or 10:1. Although embodiments of the present invention are described herein with reference to small chiplet integrated circuit devices, is the present invention is not limited thereto. Thus, the term "chiplet" should not be used for purposes of limitation, but may be used to distinguish integrated circuit elements of different sizes from one another.

The active elements described herein can be constructed in a source wafer using conventional photo-lithographic processes. The source wafer can be a crystalline semiconductor with very good electrical performance. The chiplet wires 80 can be made of metal, for example aluminum, in layers, for example metal layer 1, metal layer 2, metal layer 3, and so forth, as is done in the integrated circuit design and layout arts. The chiplet wires 80 in the various layers are used to electrically interconnect the active elements 82, 83, 84 to form electrical circuits. The top metal layer can be formed on the surface 58 of the chiplet substrate 55 to provide a connection pad 24 to which control or power signals external to the chiplet 20 can be electrically connected. The conductor 26 can be formed from a same layer and in a common processing step with the connection pad 24, for example a patterned metal layer. The conductor element 26 can be a metal interconnect such as a chiplet wire 80 or can be or include an active element 82, 83, 84 or a portion of an active element 82, 83, 84. The conductor 26 conducts or otherwise controls electrical current and is isolated from the connection pad 24 so that the conductor 26 and connection pads 24 are electrically separate and distinct. For example, the conductor 26 can be a connection pad separate from connection pad 24. A patterned insulating layer can be located in a layer beneath the conductors 26, 26′ and connection pad 24 and semiconductor layers in the active layer 54 to reduce and/or prevent unwanted electrical conduction.

The insulating layer 28 is located at least partly over the conductors 26, 26′ and connection pad 24 and is electrically insulating. The insulating layer 28 can be made of a variety of materials and perform multiple functions. The insulating layer 28 can be, for example a passivation or planarization layer and can comprise, for example, an oxide layer, a nitride layer, and/or a polymer layer, such as a resin (for example a curable resin). The insulating layer 28 does not necessarily cover the entire chiplet substrate 55, active layer 54, and conductors 26, 26′, but covers at least a portion of each of the chiplet substrate 55, active layer 54, and conductors 26, 26′.

Figure 2:
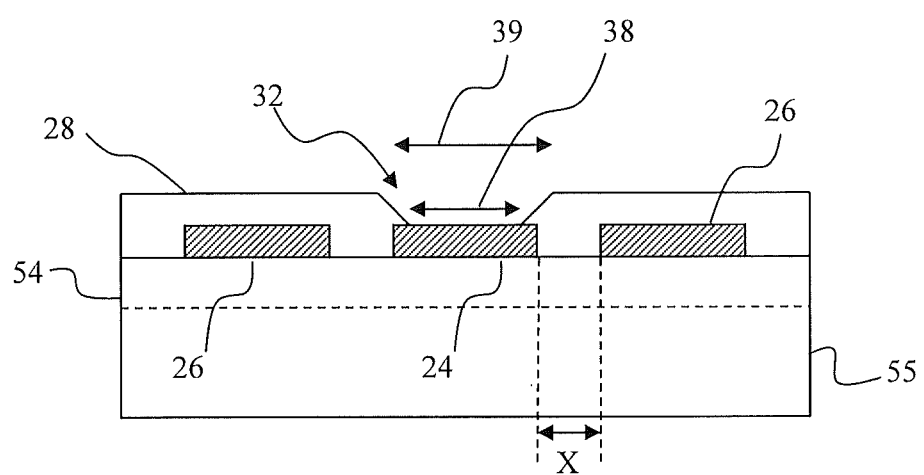
FIG. 2 is a cross section of a chiplet according to some embodiments of the present invention.

The connection pad 24 can be formed of patterned metal, for example aluminum, silver, titanium, tungsten, metal alloys, and/or layers of metals. The connection pad 24 can be exposed through the insulating layer 28 by forming a via 32 through the insulating layer 28. Vias can be formed by coating a photo-curable resin over the surface, pattern-wise curing the resin to define the via, and then etching the resin and the insulating layer 28 beneath the resin to form the via 32 and removing the resin. Methods of coating photo-curable resins, pattern-wise exposing (e.g. with ultra-violet light though a mask) and pattern-etching the resin and layers beneath the resin to form vias are used in the art. Additionally or alternatively, the coated resin can form the insulating layer 28 and/or a portion thereof. Referring to FIG. 2, the via 32 can have a larger area at the side of the insulating layer 28 opposite the chiplet substrate 55 (having a linear dimension 39) than the area on the connection pad 24 (having a linear dimension 38). In other words, the via 32 may narrow as it extends through the insulating layer 28.

In the integrated circuit design arts, it is desirable to provide as much circuitry in an integrated circuit as possible, in light of increasing demands for device functionality. Large and complex circuits can be difficult to route by providing electrical wire connections between the various elements of the circuit. Hence, it is often helpful to have many layers of interconnections. As such, it may be desirable to reduce the size or surface area the connection pads 24 so that other areas of the surface 58 of the chiplet substrate 55 and active layer 54 can be used for routing wires to other active elements 82, 83, 84 with conductors 26 independently of the connection pad 24. To enable this, the conductor 26 is not directly electrically connected to the connection pad 24. As illustrated in FIG. 1, conductor 26′ directly electrically connects active element 84 to active element 83 and is electrically isolated from the connection pad 24. Two elements are directly electrically connected when a single electrically conductive wire contacts both elements so that electrical current can flow directly from one element to the other without passing through any other intervening elements, such as electrically controlling or processing elements.

Figure 8:
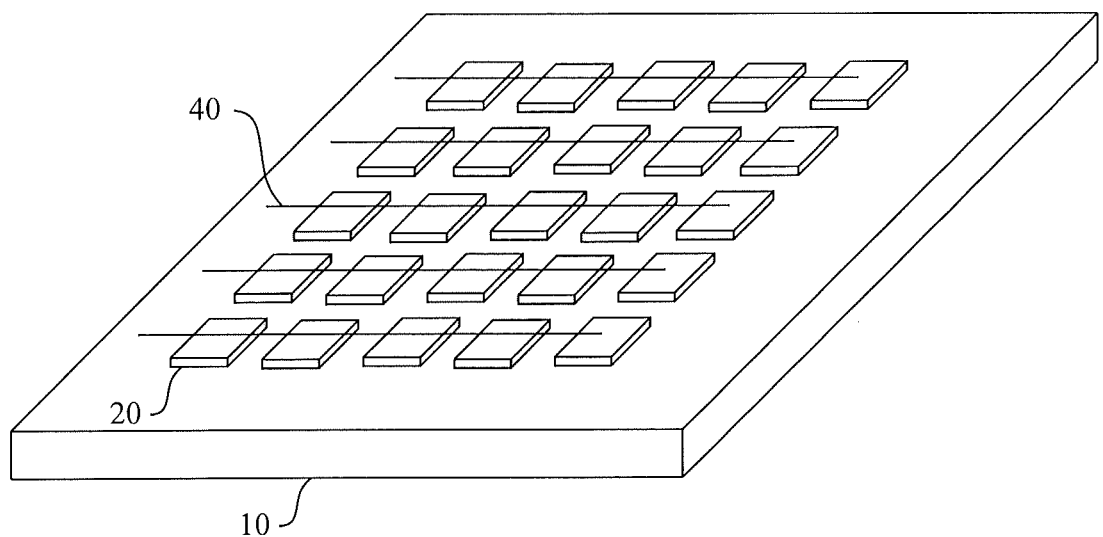
FIG. 8 is a perspective of a backplane having chiplets and wires according to some embodiments of the present invention.
Figure 9:
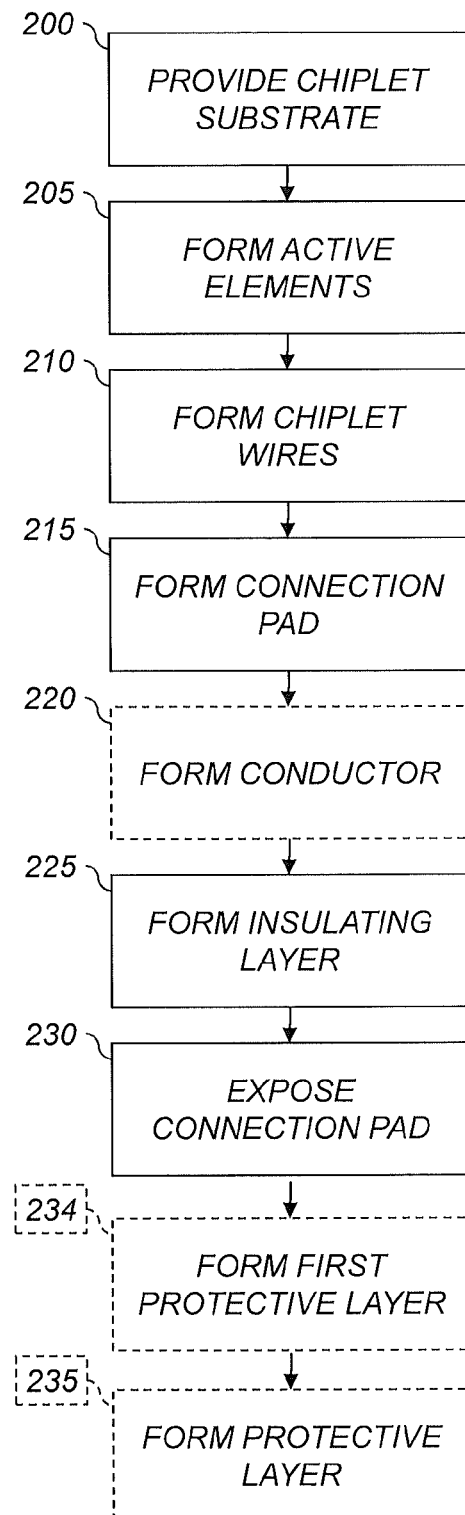
FIG. 9 is a flowchart illustrating methods of fabricating a chiplet according to some embodiments of the present invention.

As shown in FIG. 8, when located over or printed on a backplane, chiplets of the present invention provide high-performance electrical or optical devices that can be electrically connected using lower-resolution, and thus lower-cost, wiring methods and materials. The backplane can include heterogeneous components distributed over the backplane, either regularly or irregularly. Backplane substrates can be glass, polymer, metal, and/or semiconductor, for example silicon, GaAs, or other III-V materials. The chiplets can respond to external controllers located on the backplane and/or externally to the backplane.

In various embodiments of the present invention, the backplane of the present invention can be used, for example, to form an active-matrix backplane where the chiplets are organized into an array controlling a corresponding array of elements, for example pixels in a display or a digital radiographic plate. In another example, the chiplets can be light-emitters, for example light-emitting diodes or LEDs, or a vertical cavity side-emission laser (e.g. edge laser). In yet another example, the chiplets can serve to convert incident light into electricity, forming a photovoltaic device, for example with photo-diodes. In cases where it is desirable to collect or emit light efficiently, the contacts or any metal layers formed beneath the active layer can reflect incident light that passes through the active component back through the active component. In cases where a chiplet serves to convert light to electrical current, this reflection can allow for improved absorption of light by the chiplet. In the case where the chiplet emits light, or controls the emission of light by other layers, the reflection can provide improved emission of light.

Figure 3A:
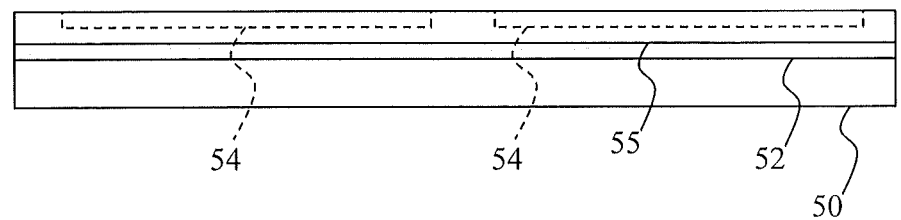
FIGS. 3A-3P are cross sections illustrating sequential stages in the fabrication and application of chiplets to a backplane according to some embodiments of the present invention.
Figure 3B:
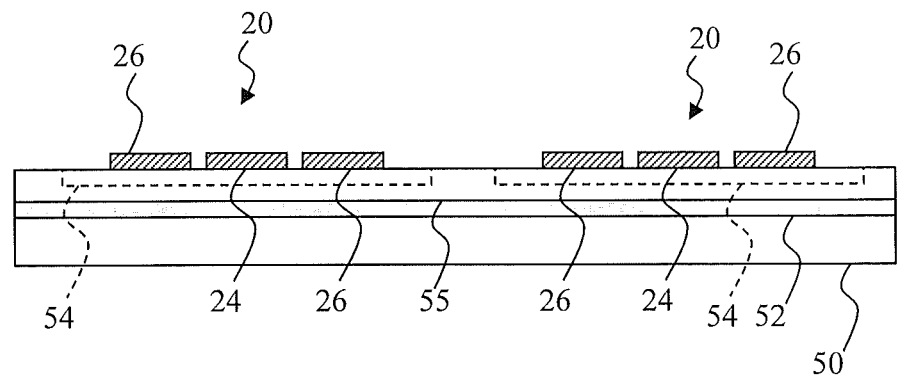
Figure 3C:
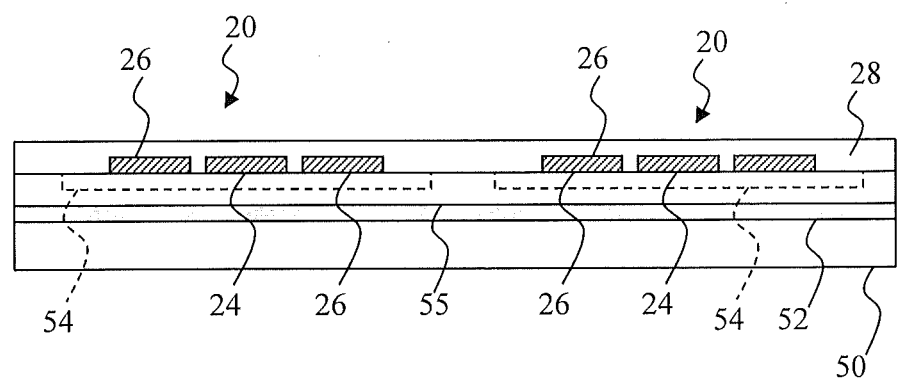
Figure 3D:
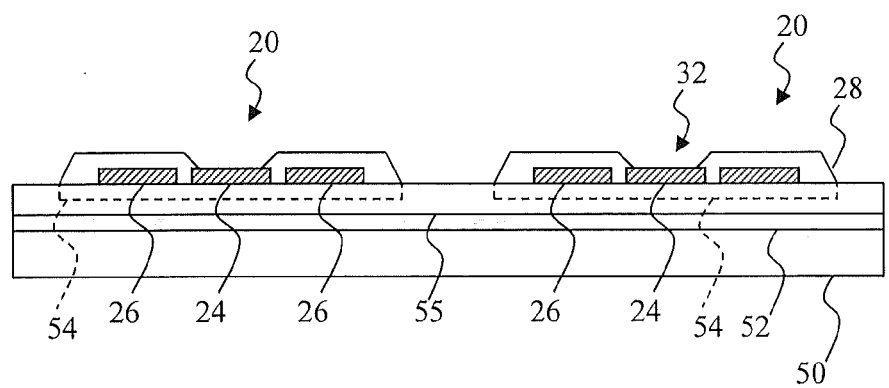
Figure 3E:
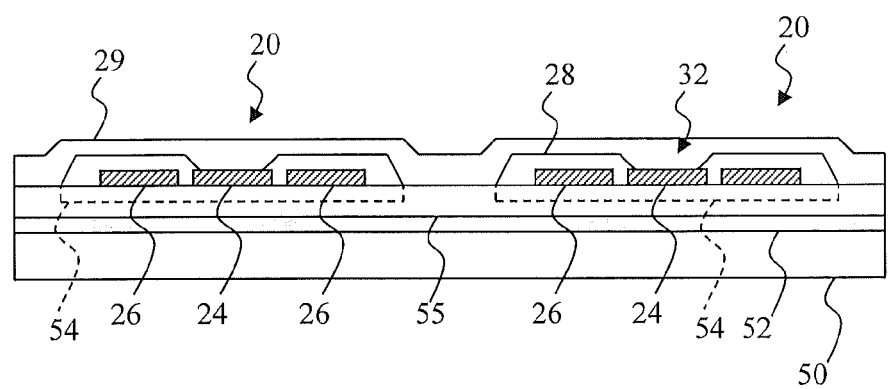
Figure 3F:
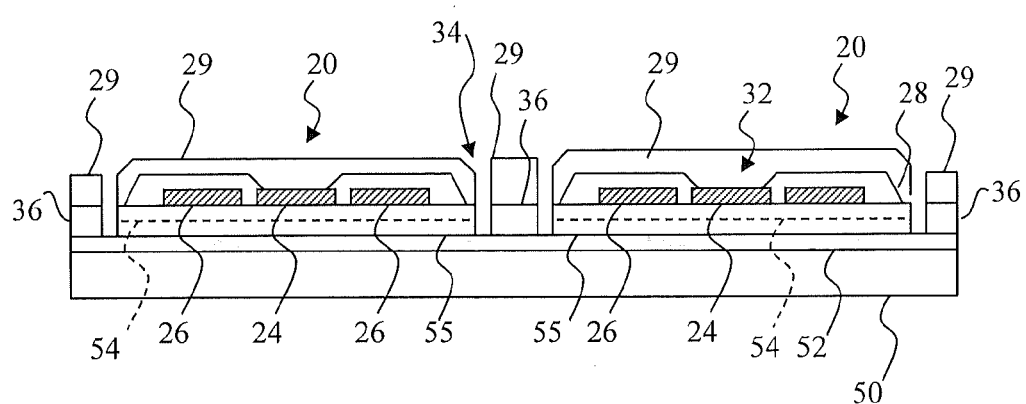
Figure 3G:
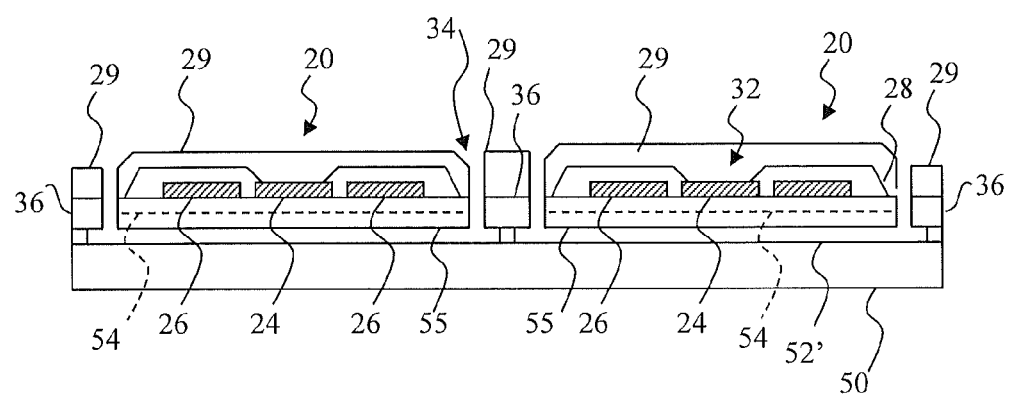
Figure 3H:
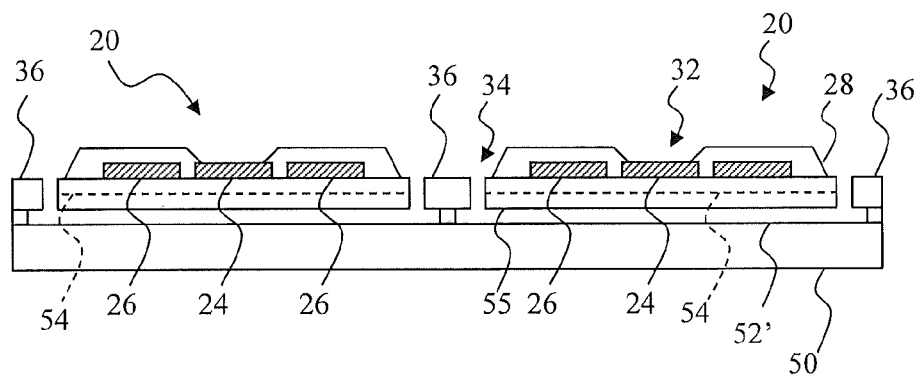
Figure 3I:
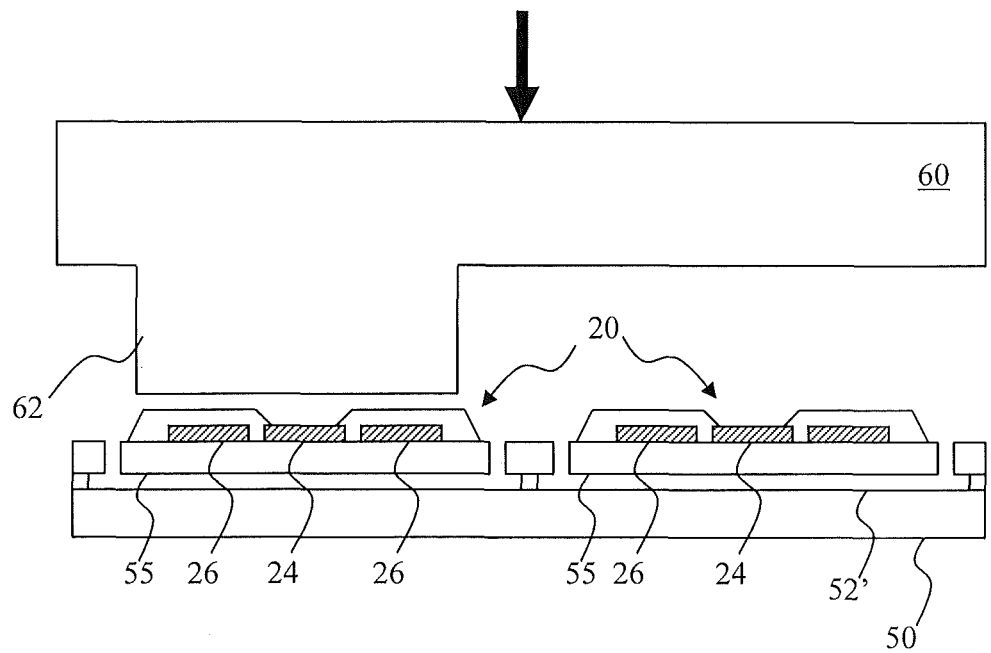
Figure 3J:
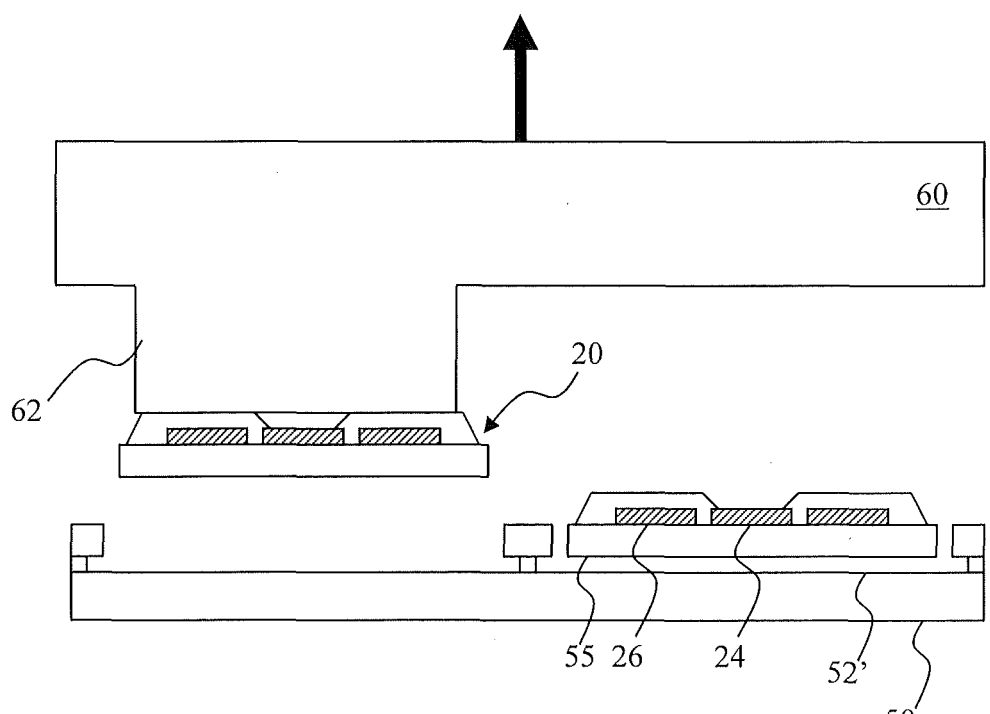
Figure 3K:
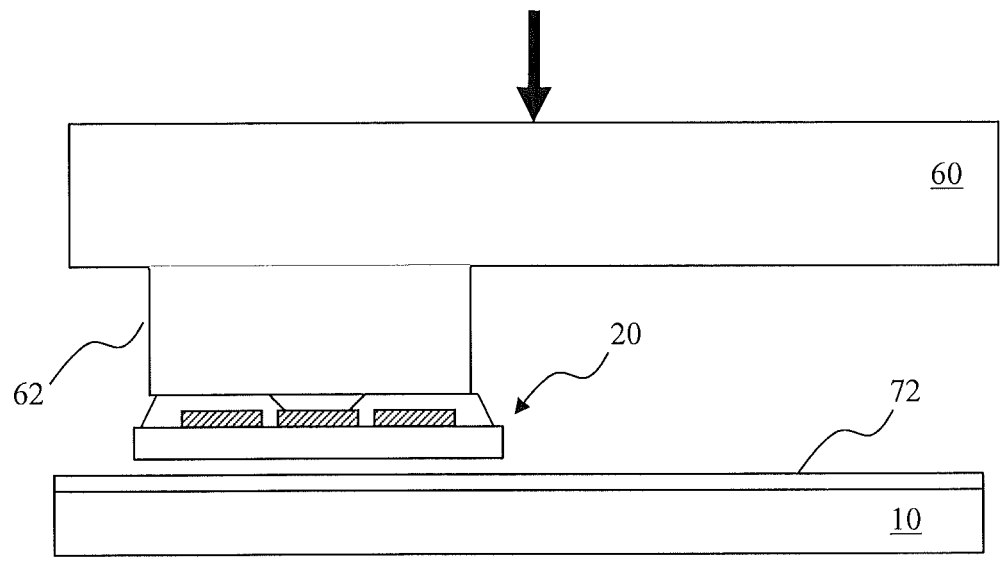
Figure 3L:
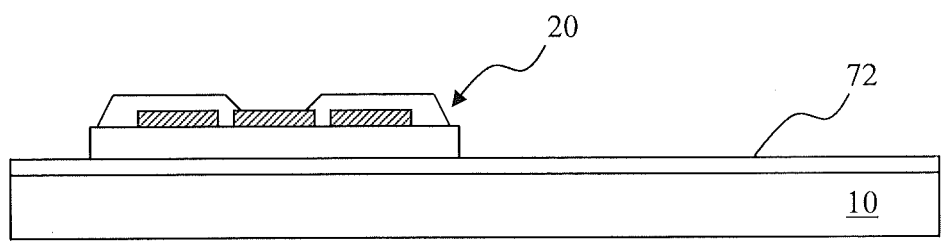
Figure 3M:
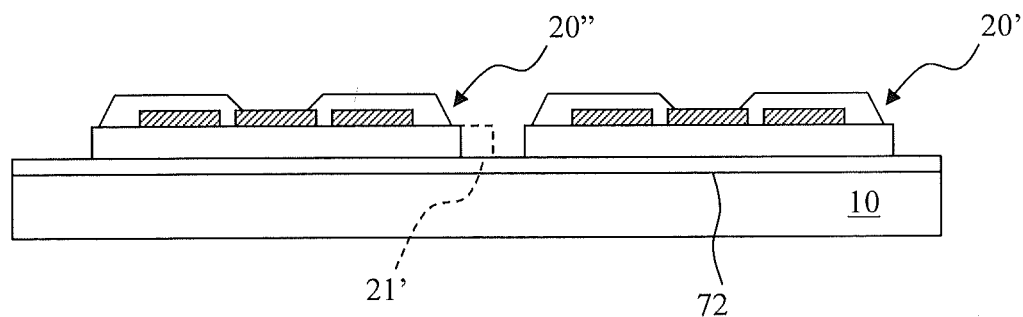
Figure 3N:
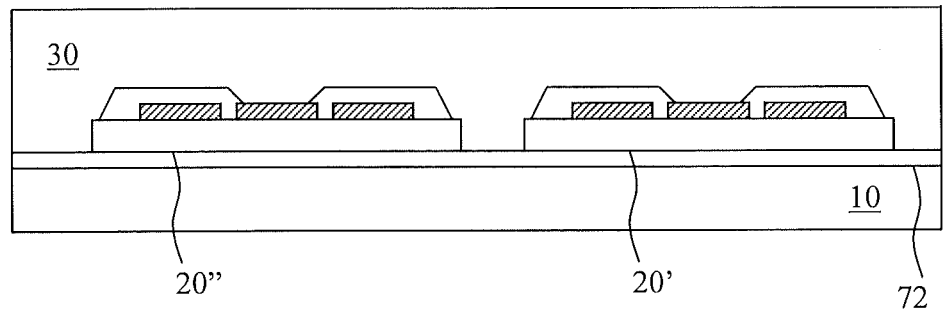
Figure 3O:
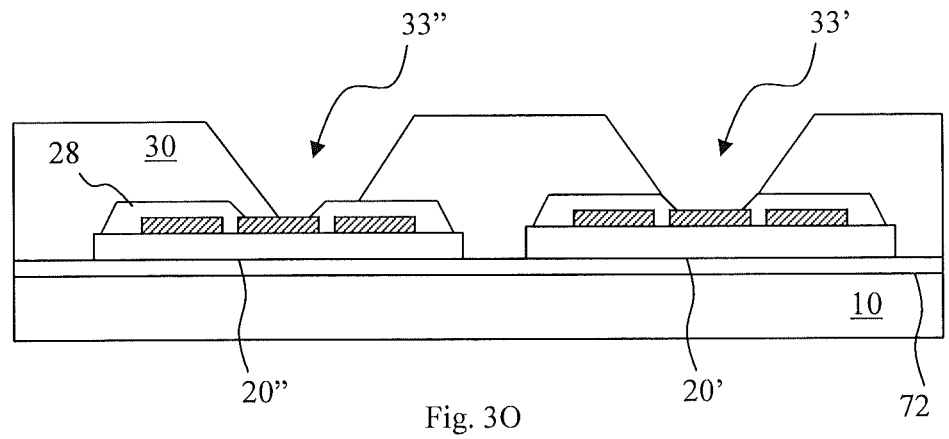
Figure 3P:
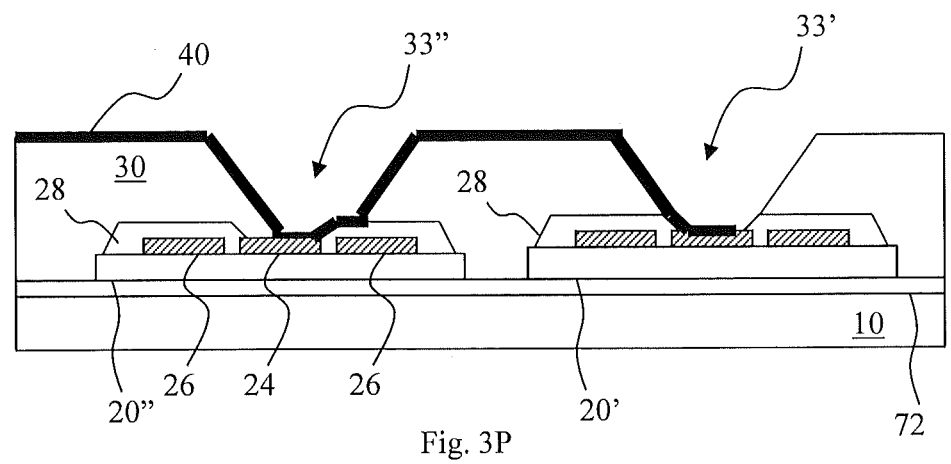

Referring to FIGS. 3A-3P, a backplane according to some embodiments of the present invention can be constructed as described below. Referring now to FIG. 3A, a source substrate 50, for example a wafer, has a sacrificial layer 52 formed thereon. The sacrificial layer 52 can be, for example, an oxide such as silicon dioxide and can be deposited by sputtering. A chiplet substrate 55 is formed over the sacrificial layer 52 and can also be deposited by sputtering. Active layer 54 can be formed by pattern-wise doping the chiplet substrate 55. The chiplet substrate 55 is processed to form active elements in the active layer 54. The chiplet substrate 55 and active layer 54 serve as the substrate of a small integrated circuit and can include additional layers and materials and can be annealed or otherwise processed to improve its characteristics, for example electron mobility. Active elements 82 (FIG. 1) can be formed within the active layer 54. In particular, the active layer 54 can include metal interconnect layers, doped material layers, and/or other layers used in the integrated circuit arts for forming active elements, such as electrical or electro-optic elements, e.g. transistors, photo-sensors, photo-voltaic elements, light-emitting diodes, etc.

Referring to FIG. 3B, connection pads 24 and conductors 26, for example formed in a patterned metallization layer, are formed on the surface (element 58 in FIG. 1) of the source substrate 50 and electrically connect the active elements in the active layer 54. The conductors 26 are not directly electrically connected to the connection pad 24. In some embodiments of the present invention, multiple connection pads 24 and conductors 26 are formed on a single chiplet. As discussed further below, the connection pads 24 can be spatially separated from each other and the conductors 26 can be located between connection pads 24 in some embodiments. Each set of active elements, connection pads 24, and conductors 26 form an integrated circuit chiplet 20.

Referring to FIG. 3C, once the connection pads 24 and conductors 26 are formed, the substrate surface, connection pads 24, and conductors 26 are coated with an insulating layer 28. The insulating layer 28 is electrically insulating and can comprise a variety of suitable materials, for example planarizing or passivation layers made of insulating material such as silicon oxides, silicon nitrides, and/or polymer resins. The insulating layer can be deposited by a variety of methods, for example by sputtering, spin coating, or curtain coating.

Referring to FIG. 3D, once coated, the insulating layer 28 can be patterned to expose at least a portion of the connection pad 24 and to cover over at least a portion of a conductor 26. In some embodiments of the present invention, the insulating layer 28 covers all, or most of, the conductor 26, as shown in FIG. 3D. The insulating layer 28 can also be patterned to expose the active layer 54 or chiplet substrate 55 between integrated circuit chiplets 20. Each wafer substrate 50 can have a plurality of integrated circuit chiplets 20 formed thereon.

In some embodiments of the present invention, wafer-scale testing can be applied at this stage. While conventional testing probes could be applied to the chiplet structures shown in FIG. 3B, the smaller connection pads are more difficult to contact with an electrical probe and a probe directed to one connection pad 24 can be shorted to neighboring connection pads 26. In contrast, when applied to the structure of FIG. 3D, an electrical probe directed to connection pad 24 cannot be shorted to other connection pads 26 due to the presence of the insulating layer 28.

Figure 15:
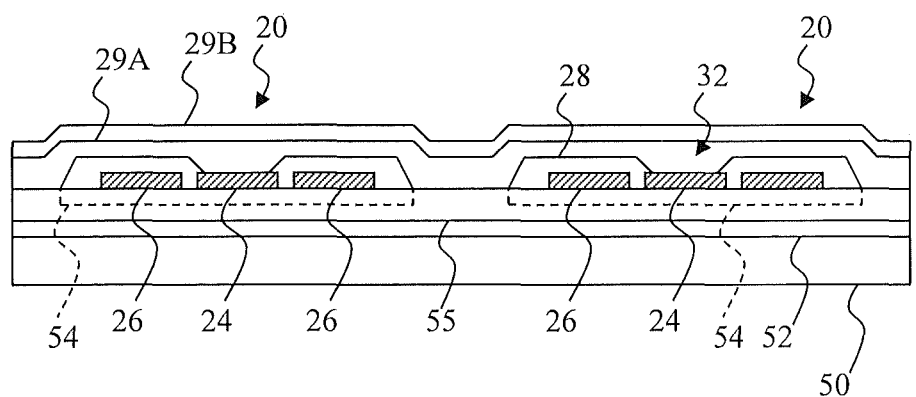
FIG. 15 is a cross section illustrating a protective bi-layer according to other embodiments of the present invention.

In some embodiments of the present invention as shown in FIG. 3E, a protective layer 29 is formed over the insulating layer 28 and connection pads 24. The protective layer 29 can be deposited by maskless sputtering or coating. The protective layer 29 can be amorphous silicon in some embodiments; however, amorphous silicon can have undesirable interactions with the conductive materials that may be used in the connection pads, such as metals and, particularly, aluminum. Therefore, in some embodiments of the present invention as illustrated in FIG. 15, the protective layer 29 can be a bi-layer 29A and 29B having different material in each layer of the bi-layer. Layer 29A can be selected and/or optimized to protect the connection pad material, for example silicon dioxide, while layer 29B compatible with layer 29A, for example amorphous silicon, can be selected and/or optimized for protection against subsequent processing steps described below, such as etching with hydrofluoric acid. Since both layers 29A and 29B are blanket coated, they can be deposited and removed (e.g. by sputtering and then etching) without further patterning process steps. Hence, the use of an additional protective layer can improve process compatibility with the release process used to fabricate printable chiplets described below.

Figure 7:
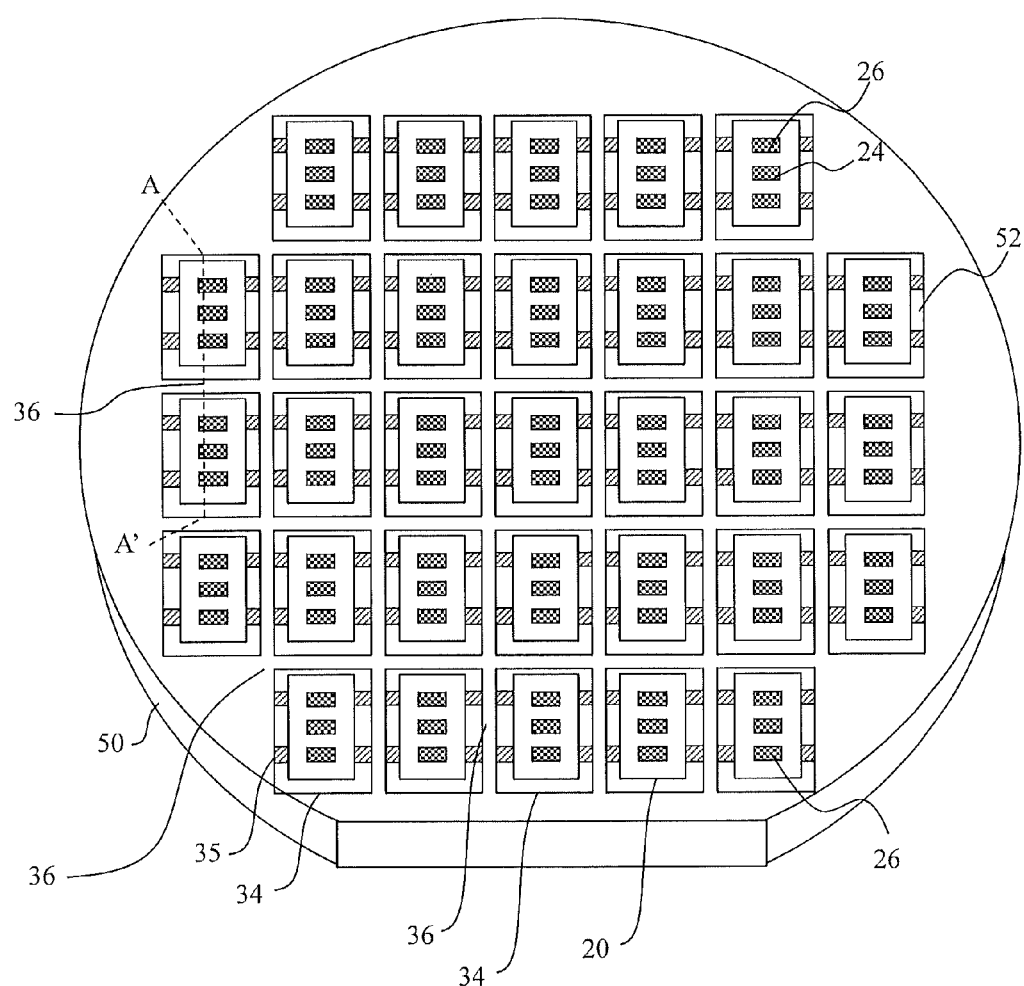
FIG. 7 is a perspective of a wafer having chiplets according to some embodiments of the present invention.

Trenches 34 are formed, as shown in FIG. 3F and also in the top view of FIG. 7, between and around each chiplet 20 through the active layer 54 to expose the sacrificial layer 52, leaving tethers 35 (FIG. 7) attaching the chiplets 20 to anchors 36 that form areas attached to the source substrate 50. The anchors 36 can be areas over the source substrate 50 and above the sacrificial layer 52 between the chiplets 20. The trenches 34 define and separate the chiplets 20 from each other and from the anchors 36. As shown in FIG. 7, the anchors 36 can include active elements and test pads (not shown) accessible to external test probes, and a plurality of electrically conductive tethers 35. Each anchor is located over and in contact with the patterned sacrificial layer 52, 52', and has a tether 35 connecting the anchor 36 to an integrated circuit chiplet 20. The tethers 35 electrically connect active elements in the integrated circuit chiplet 20 to one or more exposed electrical test pads formed in the anchor 36.

In a further process, the bi-layer of FIG. 15 can be formed in two separate steps and may involve a different etching process. After the first step (deposition of layer 29A), the trenches 34 can be etched through one or more, but not all, of the layers above the sacrificial layer 52. The second protective layer (29B) can be deposited before etching the sacrificial layer 52. By providing the protective layers 29A and 29B in two separate steps and etching different layers with different protective layers, the protective layers and etchants can be separately selected and/or optimized to provide improved results, for example better yields.

As shown in FIG. 3G, the sacrificial layer 52 is removed from beneath the chiplets 20, leaving an open location or void 52' (where the sacrificial layer was) such that the chiplets 20 are suspended by the tethers 35 (FIG. 7) over the source substrate 50. The anchors 36 are not separated from the source substrate 50 by the etching (e.g., the sacrificial layer 52 remains beneath the anchors 36), so that the chiplets 20 are still connected (through the tethers 35 and anchors 36) to the source substrate 50. The anchors 36 are shown smaller than the chiplets 20 for clarity; in practice the anchors 36 can be larger in at least one dimension than the chiplets 20 so that the chiplets 20 can be released by etching from the source substrate 50 before the anchors 36 are released. For example, by stopping the etching process at an appropriate time, the chiplets 20 can be released while the anchors 36 are not released.

FIG. 3G corresponds to the cross section indicated by A-A' in FIG. 7. Patterned etching of insulation layers, forming trenches in active layers and active element layers, and removing sacrificial layers are process steps used in semiconductor device fabrication. For example, the active layer 54 can be crystalline silicon and the sacrificial layer 52 can be an oxide, such as silicon dioxide. The sacrificial layer 52 can be etched with hydrofluoric acid. The protective layer 29 protects the other elements from chemical attack by the etchants used to form the trenches 34 and remove the sacrificial layer 52. The protective layer can be, for example amorphous silicon, and can be blanket coated over the chiplets to protect the chiplet elements against attack by etchants such as hydrofluoric acid. Once the trenches 34 are formed and the sacrificial layer 52 removed, the protective layer 29 can be removed, again without requiring a mask step, as shown in FIG. 3H. Once the protective layer 29 is removed, electrical testing can be performed, in addition to or rather than at the earlier stage before the protective layer 29 is applied at the step illustrated in FIG. 3E, as noted above. In other embodiments, the protective layer 29 can be removed at a later process step, as described below.

The chiplets and the processes described herein can include additional layers and process steps. Furthermore, the process steps can be performed in various different orders, depending on the materials and process capabilities. For example, the insulating layer etch that exposes the connection pad (shown in FIG. 3D) can be performed after the trench formation and sacrificial layer exposure, or after the removal of the sacrificial layer.

Referring to FIG. 3I, a stamp 60, for example an elastomeric or PDMS stamp, having protrusions shaped and sized to match the chiplets 20 can be pressed against the chiplets 20, breaking the tethers and adhering the chiplets 20 to the stamp 60 as the stamp 60 is removed (FIG. 3J). Not every chiplet 20 need be removed from the source substrate 50, and the stamping process can be repeated one or multiple times with different chiplets applied to different locations on the backplane substrate.

The adhered chiplets 20 on the stamp 60 are pressed against a destination backplane 10 (FIG. 3K) including an adhesive layer 72 to adhere the chiplets 20 to the backplane 10. The backplane 10 provides a target or receiving substrate on which an active device can be constructed. The adhesive layer 72 can cover only a relatively small portion of the backplane 10 so that patterned wires can be formed largely on the backplane 10, or the adhesive layer 72 can extend over much of the backplane 10 so that any patterned wires are formed largely on the adhesive layer 72. The stamp 60 can be removed and the adhesive layer 72 cured. (FIG. 3L).

As shown in FIG. 3M, the stamping process can be repeated to locate multiple chiplets over the backplane 10 in multiple locations. By laterally translating the stamp 60 relative to the backplane 10 between each stamping operation, a sparse array of chiplets can be adhered to the backplane 10. However, as noted with respect to FIG. 1, because of manufacturing process and tool limitations, a chiplet 20" can be mis-located or misaligned with respect to a desired design location 21'. The mis-location or misalignment can be random or have a random distribution and can differ from one chiplet to another so that the relative locations of the chiplets differ with respect to the desired design locations.

The protective layer (29 in FIG. 3G) can be removed at this step rather than at the step corresponding to FIG. 3H in some embodiments. Removing the protective layer at this point in the process allows the protective layer to protect the chiplets through the stamping process (FIGS. 3I-3K). As noted above, the removal of the protective layer can be a maskless process.

Referring to FIG. 3N, a planarization layer 30 is coated over the backplane 10 and chiplets 20', 20". The coating can be local to each chiplet 20', 20" or can be uniformly coated over the backplane 10. As shown in FIG. 3O, the planarization layer 30 is then processed to form a backplane via 33" over at least a portion of the exposed connection pad 24 associated with chiplet 20" and a backplane via 33' over at least a portion of the exposed connection pad 24 associated with chiplet 20'. An etchant used to form the backplane vias 33" may be selective to the insulating layer 28. In some embodiments of the present invention, the protective layer (29 in FIG. 3G) can then be removed at this step rather than at FIG. 3H. Removing the protective layer at this point in the process allows the protective layer to protect the chiplets through the stamping and planarization process (FIGS. 3I-3N). As noted above, the removal of the protective layer (if present) can be a maskless process, although in this case the protective layer may only be removed in the via area since the planarization layer 30 covers the remainder of the chiplet area (see FIGS. 13A-13C and FIGS. 14A-14C discussed below).

As shown in FIG. 3O, the via 33" is misaligned with respect to the chiplet 20" so that the via 33" exposes a portion (e.g., less than an entirety) of the connection pad 24 and chiplet via 32 and exposes at least a portion of the insulating layer 28. Such a misalignment can occur by mis-locating or misaligning the chiplet 20" on the backplane 10, the backplane 10, or by mis-locating or misaligning the process elements, e.g. masks, used to form the via 33" or to form a backplane interconnection. Note that the misalignment is between the location of the chiplet connection pad and any connecting backplane elements. Chiplet 20' and backplane via 33' are properly aligned. As shown in FIG. 3P, a backplane wire 40 is formed over the planarization layer 30 in contact with the connection pads 24 in the backplane vias 33" and 33'. Because the insulating layer 28 is formed over the conductors 26, the backplane wire 40 does not electrically connect the connection pad 24 to the conductors 26, and does not, therefore, electrically short the connection pad 24 and conductor 26.

The planarization layer 30 can comprise, for example, a curable resin, and can be patterned to form a via using photo-sensitive resins, masks, and light exposure through the masks. In embodiments illustrated in FIG. 12A, the planarization layer 30 can be removed from the surface of the chiplet 20 exposing the integrated circuit chiplet and the backplane wires formed directly on the chiplet 20 and insulating layer 28 (FIG. 12B).

Figure 13A:
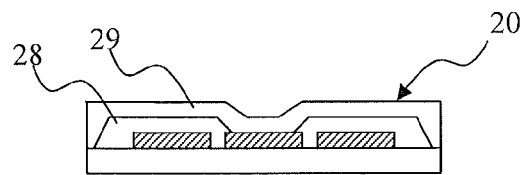
FIGS. 13A-13D are cross sections illustrating the fabrication of a backplane according to further embodiments of the present invention.
Figure 13B:
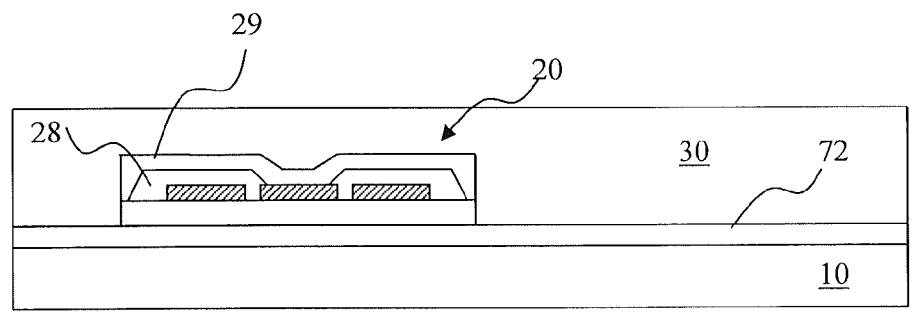
Figure 13C:
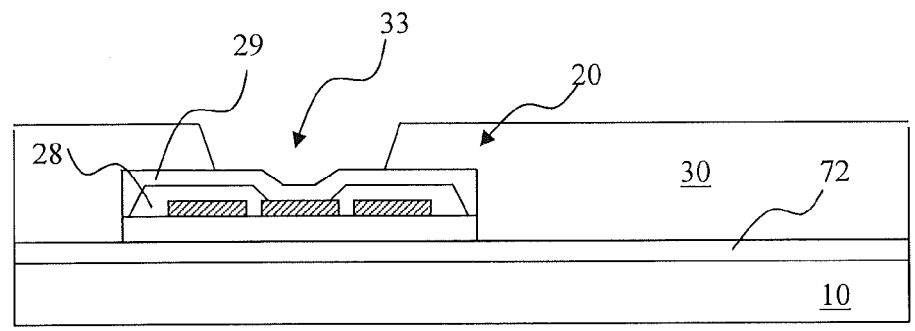
Figure 13D:
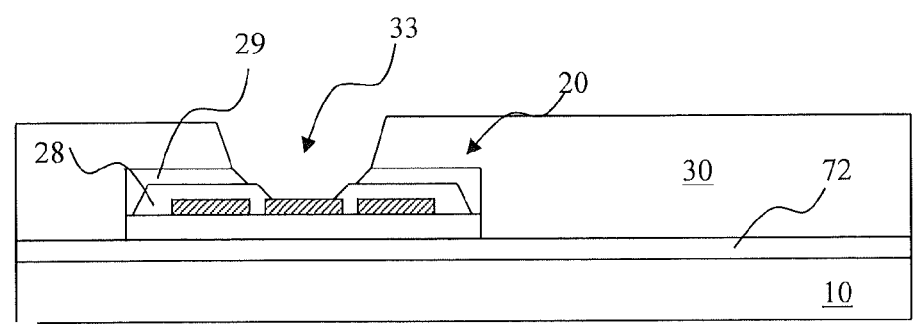

Referring to FIG. 13A, the chiplet 20 is blanket coated with a protective layer 29 (for example a passivation layer) before it is removed from the wafer source substrate. The chiplet is then located on the backplane 10 (FIG. 13B) and coated with planarization layer 30, and a backplane via 33 formed in the planarization layer 30 (FIG. 13C) and the protective layer 29 removed (FIG. 13D) in the via 33 before the formation of any interconnections. The protective layer 29 removal does not require patterning and can be performed after the planarization layer is processed.

Figure 12A:
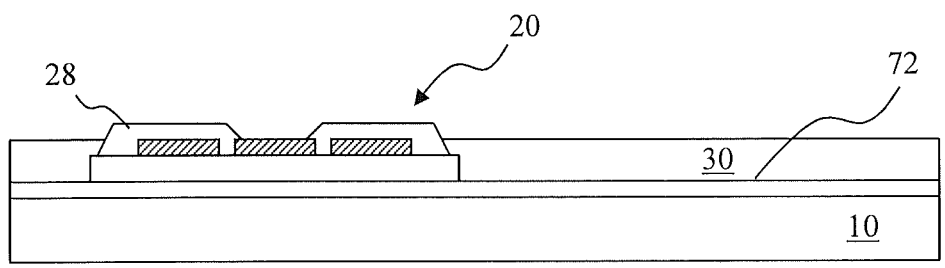
FIGS. 12A and 12B are cross sections illustrating the fabrication of a backplane according to some embodiments of the present invention.
Figure 12B:
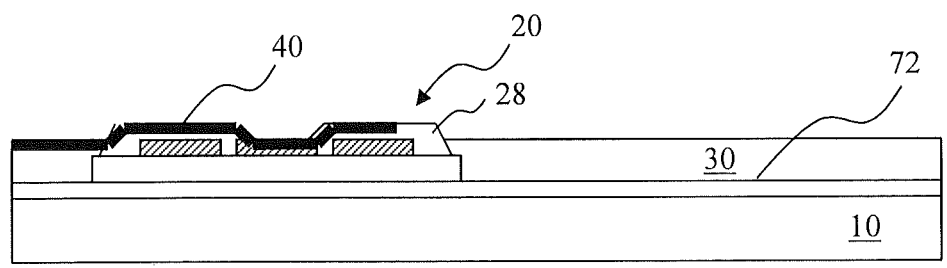
Figure 14A:
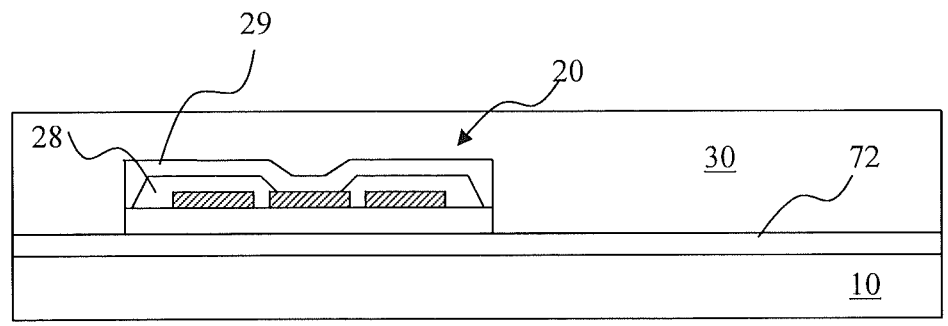
FIGS. 14A-14C are cross sections illustrating the fabrication of a backplane according to other embodiments of the present invention.
Figure 14B:
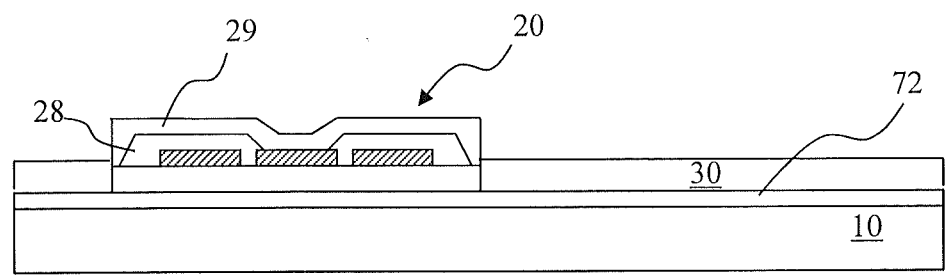
Figure 14C:
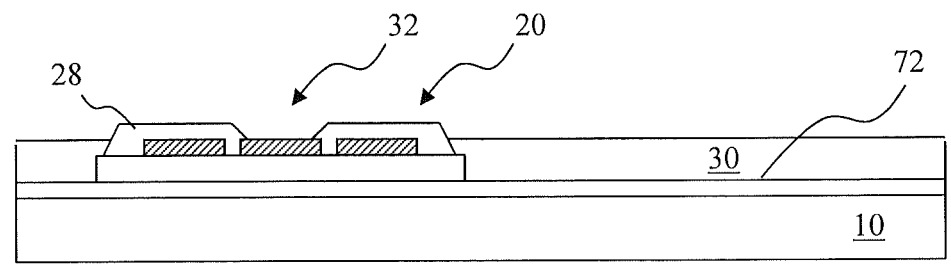

Referring to FIGS. 14A-14C, the process illustrated in FIGS. 12A and 12B can also be employed with the blanket-coated protection layer of FIGS. 13A-13D. In these embodiments, the entire protective layer 29 is removed from the surface of the chiplet 20. Referring to FIG. 14A, the chiplets 20 on the backplane 10 have a protective layer 29 (formed as in FIG. 13A) and the backplane 10 has a blanket-coated planarization layer (as in FIG. 13B). Referring to FIG. 14B, the planarization layer 30 is removed to below the surface of the chiplet 20 (as in FIG. 12A) exposing the protective layer 29. The protective layer 29 is then removed from the surface of the chiplet 20 and the chiplet via 32 and the insulating layer 28 are exposed. The steps of reducing the planarization layer 30 and removing the protective layer 29 are maskless. Hence, in FIGS. 14A-14C, the only process step after the chiplet construction that requires a mask is the formation of the chiplet via 32 on the wafer source substrate. Moreover, if the process of FIGS. 14A-14C is employed, no mask step at all may be required for backplane processing if the etching process is carefully controlled to expose the connection pads. Metal interconnects, such as those of FIG. 12B, can then be formed using either masked patterning or micro-deposition (such as inkjet) of conductive material. Thus, embodiments of the present invention enable backplane interconnection methods that require fewer large-area photolithographic processes, particularly patterning processes.

For clarity of illustration, FIGS. 12A-B, 13B-D, and 14A-C show only a single chiplet 20 on the backplane 10. However, the present invention includes backplanes having two or more chiplets 20 thereon. In one embodiment, the backplane of the present invention includes an array of chiplets 20 as illustrated in FIG. 8.

The present invention can provide a chiplet structure that is robust in the presence of manufacturing process faults that may create relative mis-alignments between features on a chiplet and features on the backplane, even when using relatively small features on the chiplet, e.g. the connection pad. The small features can provide additional space within the chiplets for active elements or wiring, thereby increasing the functionality of the chiplets an enabling improved electrical performance. Specifically, embodiments of the present invention can enable smaller connection pads that do not require as much space on a chiplet substrate surface. Therefore, chiplets can have a greater functionality or, alternatively, smaller chiplets can be employed. For example, in embodiments of the present invention, chiplet location tolerances of 10 microns can be used, whereas, conventional tolerances can be 5 microns, 2 microns, or 1 micron. Thus interconnection methods that have greater margins of error can be applied to transfer-printed substrates. Hence, embodiments of the present invention can provide higher manufacturing yields and lower costs in the presence of manufacturing variability and can employ lower-cost tools to manufacture backplanes.

Embodiments of the present invention can provide advantages of improved electrical performance and density in integrated circuits transfer-printed over large substrates. Aspects of the invention can also reduce the number of large-area photolithographic steps, reduce alignment tolerance requirements, and are compatible with wafer testing and high-yield release processes for the transfer-printed integrated circuits.

Figure 4A:
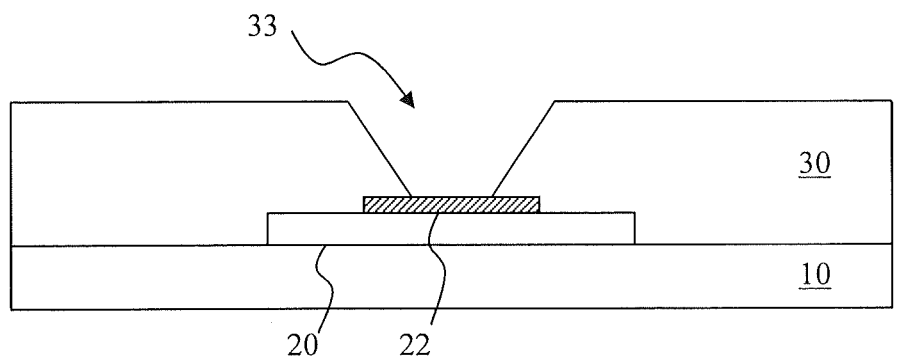
FIGS. 4A-4C are cross sections illustrating misalignment of a chiplet having a large connection pad on a backplane.
Figure 4B:
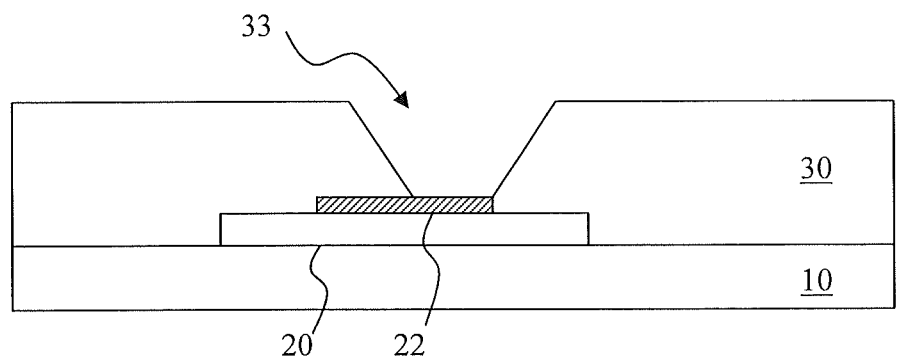
Figure 4C:
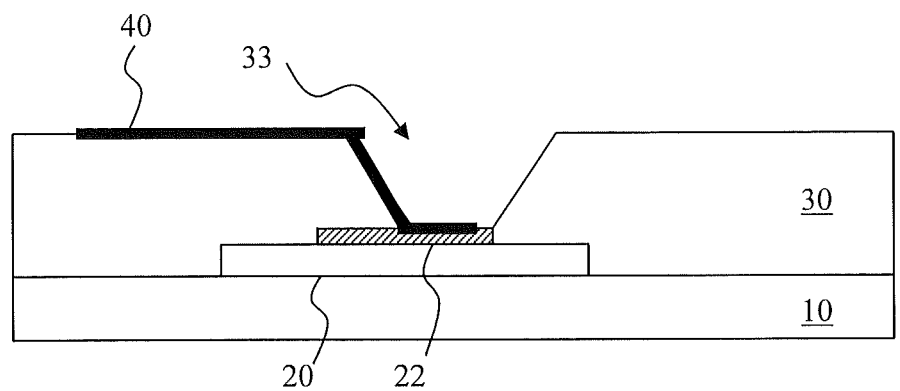

Some advantages of the present invention will now be described in greater detail with reference to FIGS. 4A to 4C and FIGS. 5A to 5C. Referring first to FIGS. 4A-4C, a chiplet 20 with a relatively large connection pad 22 is located on a backplane 10 with a planarizing layer 30 and corresponding backplane via 33. As shown in FIG. 4A, if the backplane via 33 is properly aligned with the chiplet 20 large connection pad 22, a wire formed over the planarizing layer 30 can contact the large connection pad 22. If the backplane via 33 is not properly aligned with the chiplet 20 large connection pad 22, as shown in FIG. 4B, a wire formed over the planarizing layer 30 can still contact the large connection pad 22 without difficulty because the surface of the large connection pad 22 extends far enough along the chiplet 20 surface to compensate for some relative mis-alignment between the backplane 10 and the chiplet 20. Thus, a backplane wire 40 formed over the planarizing layer 30 can still contact the large connection pad 22, as shown in FIG. 4C. However, the large connection pad 22 occupies a relatively large amount of space on the surface of the chiplet 20, thereby reducing the potential functionality of the chiplet.

Figure 5A:
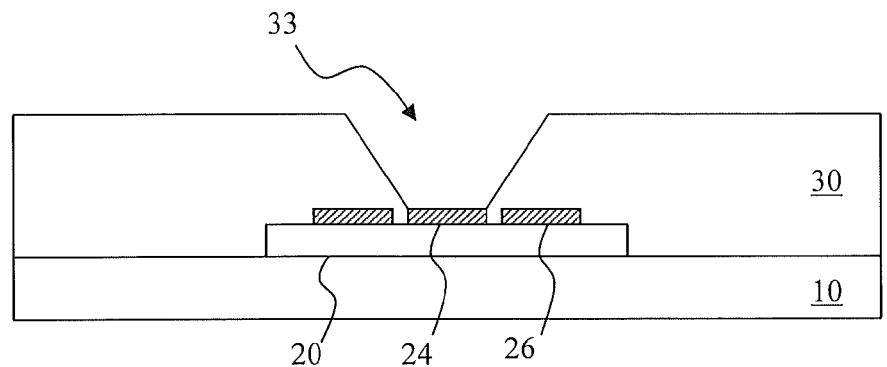
FIGS. 5A-5C are cross sections illustrating misalignment of a chiplet having small connection pads on a backplane.
Figure 5B:
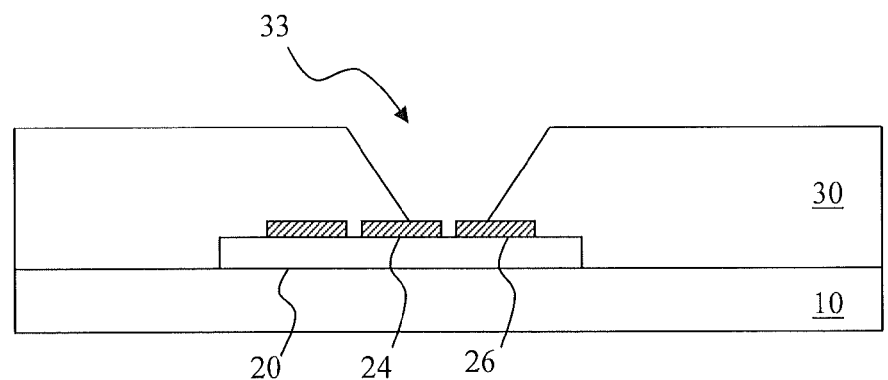
Figure 5C:
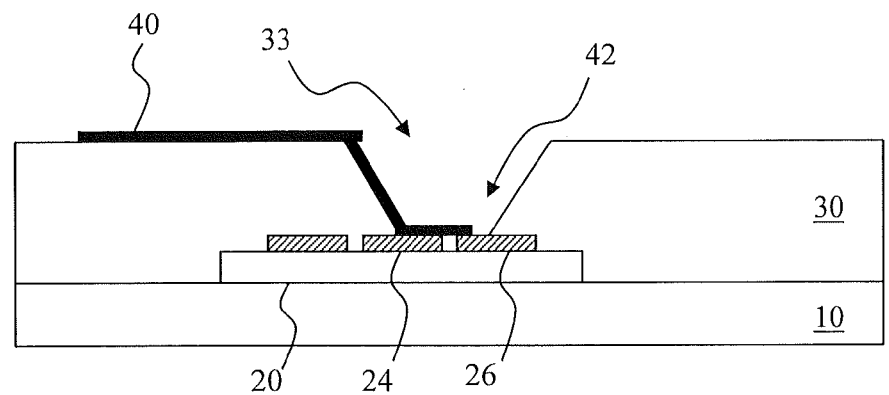

Referring to FIGS. 5A-5C, a chiplet 20 with a relatively small connection pad 24 and relatively small conductors 26 are located on a backplane 10 with a planarizing layer 30 and corresponding backplane via 33. Because smaller connection pads and conductors are used, compared to those in FIGS. 4A-4C, the chiplet 20 can have increased functionality by employing the space otherwise used by a large connection pad for additional circuitry and circuit connections. As shown in FIG. 5A, if the backplane via 33 is properly aligned with the chiplet 20 small connection pad 24, a wire formed over the planarizing layer 30 can contact the small connection pad 24 without difficulty. If the backplane via 33 is not properly aligned with the chiplet 20 small connection pad 24, as shown in FIG. 5B, a wire formed over the planarizing layer 30 can contact not only the small connection pad 24 but also the conductor 26. Thus, a backplane wire 40 formed over the planarizing layer 30 can form an electrical short circuit 42 between the small connection pad 24 and the conductor 26, as shown in FIG. 5C.

Figure 6A:
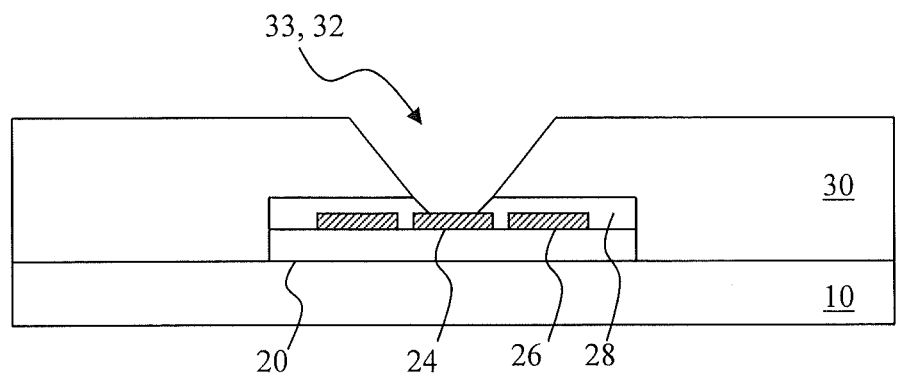
FIGS. 6A-6C are cross sections illustrating a chiplet on a backplane according to some embodiments of the present invention that addresses the misalignment illustrated in FIGS. 5A-5C.
Figure 6B:
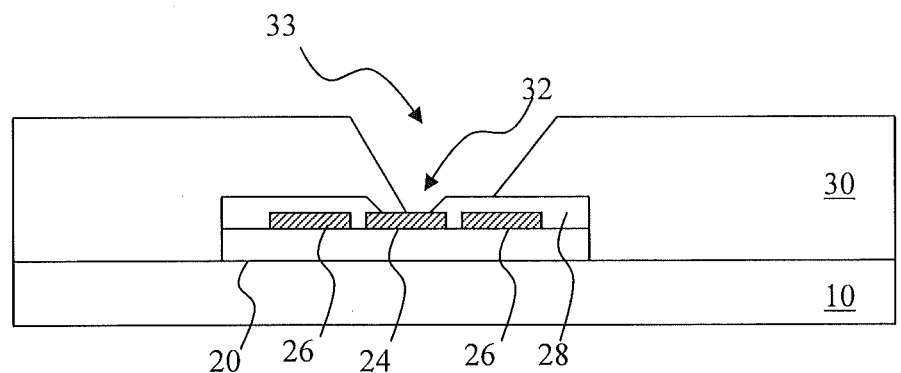
Figure 6C:
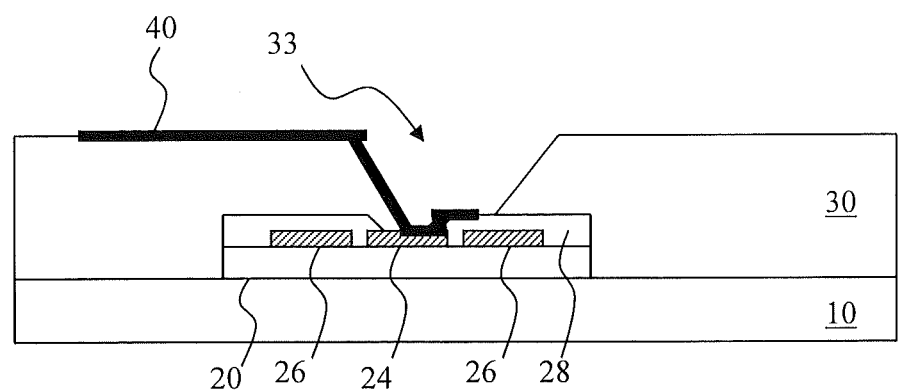

Referring to FIGS. 6A-6C, according to some embodiments of the present invention, a chiplet 20 with a small connection pad 24, small conductors 26, insulating layer 28, and chiplet via 32 is located on a backplane 10 having a planarizing layer 30 and corresponding backplane via 33. As shown in FIG. 6A, if the backplane via 33 is properly aligned with the small connection pad 24 and chiplet via 32, a wire formed over the planarizing layer 33 can contact the small connection pad 24 without difficulty. As shown in FIG. 6B, if the backplane via 33 is not properly aligned with the small connection pad 24 and chiplet via 32, the backplane via 33 can expose at least a portion of the connection pad 24 and the insulating layer 28 over the conductor 26. A backplane wire 40 formed over the planarizing layer 30 therefore contacts only the small connection pad 24 and does not contact the conductor 26 because of the insulating layer 28, as shown in FIG. 6C. Hence, a wire that electrically connects a chiplet mis-aligned with respect to the backplane 10 does not cause short circuits on the chiplet surface and still allows the use of space-conserving small connection pads 24 and additional, high-density conductors 26 for interconnecting active elements in the integrated circuit chiplet 20.

In some embodiments, multiple connection pads 24 on a single chiplet 20 can be spaced apart from one another as far as is practical so that any mis-alignment between the chiplet 20 and backplane 10 will not result in short circuits between two connection pads 24 on the same chiplet 20. In particular, because each of the connection pads 24 will have an exposed portion, connection pads 24 that are too close together can be short circuited by wires 40. Therefore, in some embodiments, one or more of the conductors 26 may be arranged between adjacent connection pads 24 to separate the connection pads 24 so far as is practical.

As illustrated in FIG. 9 and FIGS. 3A-3F, an integrated circuit according to various embodiments of the present invention can be made by providing a chiplet substrate in step 200, forming active elements on or in the chiplet substrate in step 205, forming chiplet wires electrically connecting the active elements and the connection pad in step 210, forming a connection pad on a surface of the chiplet substrate in step 215, forming one or more conductors electrically separate from the connection pad on the surface of the chiplet substrate in step 220, the conductors electrically connected to a chiplet wire or active element, and forming an insulating layer over the chiplet substrate and the conductor in step 225, leaving at least a portion of the connection pad exposed. The connection pad can be exposed with vias by photo-lithographically patterned etching of the insulating layer to pattern-wise expose the connection pad in step 230. An optional first protective layer (as discussed with reference to FIG. 15) can be formed over the insulating layer and the exposed connection pads in step 235.

As illustrated in FIG. 10 and FIGS. 3A-3H, a wafer having integrated circuits according to various embodiments of the present invention can be made by providing a wafer substrate in step 300, forming a sacrificial layer over the wafer substrate in step 305, forming an active layer over the sacrificial layer in step 310, and forming a plurality of integrated circuits on or in the active layer in step 315. Each integrated circuit can include active elements formed on or in the active layer, a connection pad formed on a surface of the active layer, chiplet wires electrically connecting the active elements and the connection pad, a conductor electrically separate from the connection pad formed on the surface of the active layer and electrically connected to a chiplet wire or active element, and an insulating layer formed over the active layer and the conductor, leaving at least a portion of the connection pad exposed. The integrated circuit chiplets can be made according to the methods described in FIG. 9. The integrated circuits can be released from the wafer as described in FIGS. 3A-3O in step 320 and the protective layer, if formed in step 235 (FIG. 9), can be removed in step 325.

Figures 10, 11:
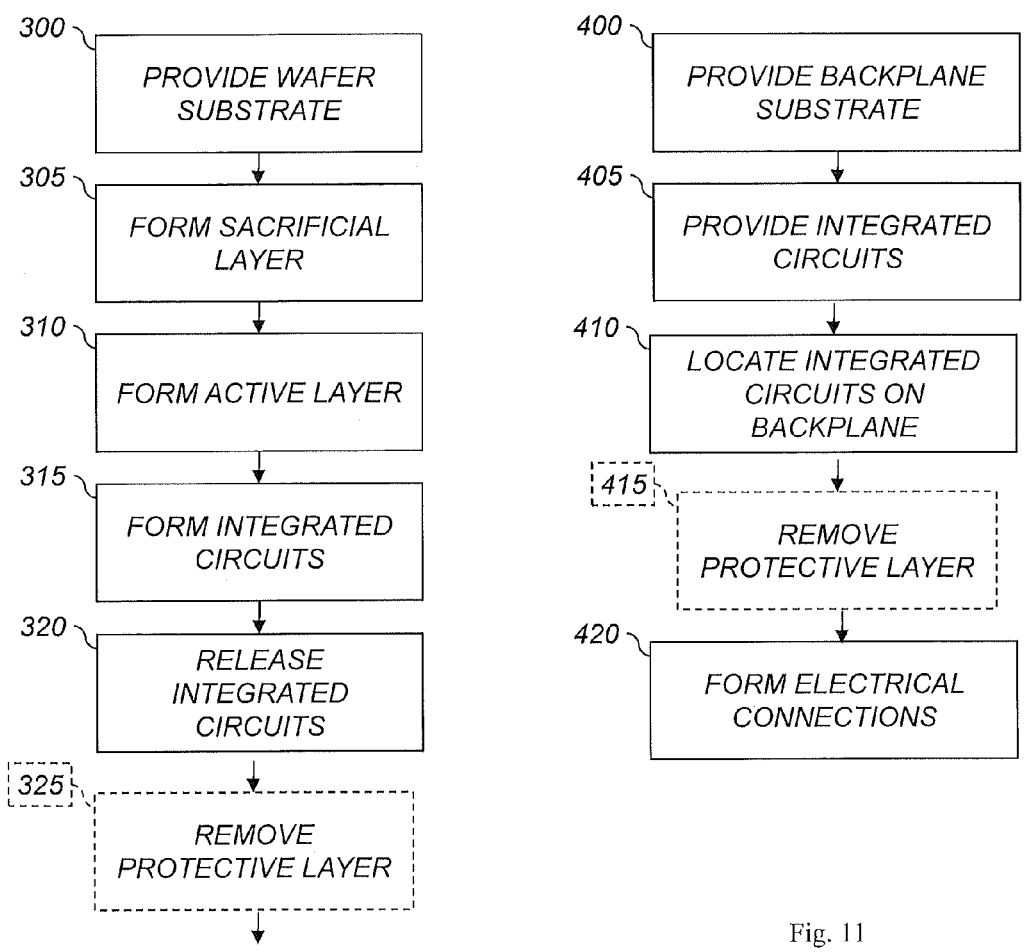
FIG. 10 is a flowchart illustrating methods of fabricating integrated circuits on a source wafer according to some embodiments of the present invention.
FIG. 11 is a flowchart illustrating the formation of a backplane according to some embodiments of the present invention.

According to embodiments of the present invention illustrated in FIG. 11 and FIGS. 3A-3P, a method of making a backplane having integrated circuits includes the steps of providing a backplane substrate in step 400 and providing a plurality of integrated circuits located on the backplane in step 405. The integrated circuits can be located on the backplane in step 410, for example, using a transfer printing process. Each integrated circuit can include a chiplet substrate, active elements formed on or in the chiplet substrate, a connection pad formed on a surface of the chiplet substrate, chiplet wires electrically connecting the active elements and the connection pad, a conductor electrically separate from the connection pad formed on the surface of the chiplet substrate and electrically connected to a chiplet wire or active element, and an insulating layer formed over the chiplet substrate and the conductor, leaving at least a portion of the connection pad exposed. The integrated circuit chiplets can be made according to the methods described in FIG. 9 in some embodiments. A protective layer can optionally be formed over the insulating layer and exposed connection pad in step 235. If the protective layer was formed (step 235 FIG. 9) and not removed in step 325 (FIG. 10), it can be removed in step 415 before electrical connections are made in a single layer to the connection pads in step 420.

Referring to FIG. 3G and FIG. 7, according to some embodiments of the present invention, a structured substrate having transferrable integrated circuit chiplets, includes a substrate 50, a patterned sacrificial layer 52, 52' formed on the substrate 50, and a plurality of integrated circuit chiplets 20 formed on the patterned sacrificial layer 52, 52'. Each integrated circuit chiplet 20 includes a separate chiplet substrate 55 having a surface, where the separate chiplet substrate 55 detached from the substrate 50 by the pattern of the sacrificial layer 52, 52'. Active elements are formed on or in the chiplet substrate 55, a connection pad 24 is formed on the surface of the chiplet substrate 55, and chiplet wires are formed on or in the chiplet substrate 55 electrically connecting the active elements and the connection pad 24. A conductor 26 electrically separate from the connection pad 24 is formed on the surface of the chiplet substrate 55, where the conductor 26 electrically connected to a chiplet wire or active element. A patterned insulating layer 28 is formed over the chiplet substrate 55 and the conductor 26, leaving at least a portion of the connection pad exposed 24.

According to other embodiments of the present invention, a method of fabricating a structured substrate having transferrable integrated circuit chiplets includes the steps of providing a substrate, forming a sacrificial layer on the substrate, forming a chiplet substrate layer on the sacrificial layer, the chiplet substrate layer having a surface, forming active elements on or in the chiplet substrate layer, forming a connection pad on the surface, forming chiplet wires on or in the chiplet substrate electrically connecting the active elements and the connection pad, forming a conductor electrically separate from the connection pad on the surface, the conductor electrically connected to a chiplet wire or active element, forming an insulating layer over the chiplet substrate and the conductor, leaving at least a portion of the connection pad exposed, and patterning the chiplet substrate layer and the sacrificial layer to form separate chiplet substrates detached from the substrate.

In comparison to other thin-film manufacturing methods, using densely populated source substrates and transferring chiplets to a backplane substrate that requires only a sparse array of active components located thereon need not waste or require active layer material on a backplane substrate. Embodiments of the present invention can be used in transferring chiplets made with crystalline semiconductor materials that have much higher performance than thin-film active components. Furthermore, the flatness, smoothness, chemical stability, and heat stability requirements for a backplane substrate used in embodiments of the present invention can be greatly reduced because the adhesion and transfer process is not significantly limited by the backplane substrate material properties. Manufacturing and material costs can also reduced because of higher utilization rates of expensive materials (e.g. the active substrate) and reduced material and processing requirements for the backplane substrate. Embodiments of the present invention can also provide improved circuit density in small integrated circuits while reducing alignment and tolerance requirements for chiplets placed on a backplane. Thus, performance can be increased and costs can be reduced for active integrated circuits distributed over backplanes.

Furthermore, embodiments of the present invention can provide a reduction in masking steps on the backplane improving yields and reducing costs, can provide reduced connection pad size improving device functionality, and can provide less stringent tolerance requirements thereby improving yields and reducing processing costs.

The present invention has been described in detail with particular reference to certain embodiments thereof, but it will be understood that variations and modifications can be effected within the spirit and scope of the invention. This application also incorporates the disclosure of U.S. Pat. No. 7,622,367, which is entitled Methods and Devices for Fabricating and Assembling Printable Semiconductor Elements, by reference. The disclosures of U.S. patent application Ser. No. 12/732,868 entitled Methods of Forming Printable Integrated Circuit Devices and Devices Formed Thereby, U.S. Provisional Patent Application No. 61/371,467 entitled Materials And Processes for Releasing Printable Compound Semiconductor Devices, U.S. Provisional Patent Application No. 61/318,508 entitled Selective Transfer of Active Components, and U.S. Provisional Patent Application No. 61/377,131 entitled Structures And Methods for Testing Printable Integrated Circuits are also incorporated by reference herein.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the specification, there have been disclosed embodiments of the invention and, although specific terms are employed, they are used in a generic and descriptive sense only and not for purposes of limitation. Hence, it is intended that the above embodiments and all of such variations and modifications be included within the scope and spirit of the invention as defined by the claims that follow.

That which is claimed:

1. A method of assembling integrated circuit elements on a substrate, the method comprising:
   providing integrated circuit elements on a receiving substrate having pre-determined corresponding desired positions, each of the integrated circuit elements comprising a chiplet substrate including a connection pad and a conductor element on a surface thereof, wherein the connection pad and the conductor element are electrically separated, and wherein at least one of the integrated circuit elements is misaligned on the receiving substrate relative to the corresponding desired position thereon such that the at least one of the integrated circuit elements is positioned on the receiving substrate at a distance from the corresponding desired position that is greater than or equal to a distance between the conductor element and the connection pad; and
   forming a conductive layer on the receiving substrate including the integrated circuit elements thereon such that the connection pad of each of the integrated circuit elements is electrically connected to the conductive layer and the conductor element is separated from the conductive layer notwithstanding that the at least one of the integrated circuit elements is misaligned on the receiving substrate.

2. The method of claim 1, wherein each of the integrated circuit elements includes an insulating layer on the chiplet substrate that exposes at least a portion of the connection pad to the conductive layer and covers the conductor element on the surface of each chiplet substrate to electrically separate the conductor element from the conductive layer.

3. The method of claim 2, wherein forming the conductive layer comprises:
   forming a planarization layer including via openings therein on the receiving substrate including the integrated circuit elements thereon, wherein respective positions of the via openings in the planarization layer are based on respective desired positions of the integrated circuit elements on the receiving substrate; and then
   forming the conductive layer on the planarization layer and in the via openings to electrically contact the connection pad of each of the integrated circuit elements.

4. The method of claim 2, wherein providing the integrated circuit elements on the receiving substrate comprises:
   forming the integrated circuit elements including a plurality of active elements on a source substrate; and
   transferring the integrated circuit elements from the source substrate to the receiving substrate such that the at least one of the integrated circuit elements is misaligned on the receiving substrate relative to the desired position.

5. The method of claim 2, wherein the connection pad of each of the integrated circuit elements is coupled to an active element therein such that the conductive layer provides an electrical connection between respective active elements of each chiplet substrate, and wherein the conductor element of each of the integrated circuit elements provides an electrical connection between respective active elements of a same chiplet substrate.

6. A method of assembling integrated circuit elements on a substrate, the method comprising:
   providing integrated circuit elements on a receiving substrate, each of the integrated circuit elements comprising a chiplet substrate including a connection pad and a conductor element on a surface thereof, wherein the connection pad and the conductor element are electrically separated, and wherein at least one of the integrated circuit elements is misaligned on the receiving substrate relative to a desired position thereon such that the at least one of the integrated circuit elements is positioned on the receiving substrate at a distance from the desired position that is greater than or equal to a distance between the conductor element and the connection pad; and forming a conductive layer on the receiving substrate including the integrated circuit elements thereon such that the connection pad of each of the integrated circuit elements is electrically connected to the conductive layer notwithstanding that the at least one of the integrated circuit elements is misaligned on the receiving substrate, wherein each of the integrated circuit elements includes an insulating layer on the chiplet substrate that exposes at least a portion of the connection pad to the conductive layer and covers the conductor element on the surface of each chiplet substrate to electrically separate the conductor element from the conductive layer, wherein forming the conductive layer comprises:

forming a planarization layer including via openings therein on the receiving substrate including the integrated circuit elements thereon, wherein respective positions of the via openings in the planarization layer are based on respective desired positions of the integrated circuit elements on the receiving substrate; and then forming the conductive layer on the planarization layer and in the via openings to electrically contact the connection pad of each of the integrated circuit elements, and wherein at least one of the via openings exposes a portion of the connection pad and a portion of the insulating layer covering the conductor element of the at least one of the integrated circuit elements that is misaligned on the receiving substrate.

7. The method of claim 6, wherein the exposed portion of the connection pad is smaller than a dimension of the at least one via opening.

8. A method of assembling integrated circuit elements on a substrate, the method comprising:

providing integrated circuit elements on a receiving substrate, each of the integrated circuit elements comprising a chiplet substrate including a connection pad and a conductor element on a surface thereof, wherein the connection pad and the conductor element are electrically separated, and wherein at least one of the integrated circuit elements is misaligned on the receiving substrate relative to a desired position thereon such that the at least one of the integrated circuit elements is positioned on the receiving substrate at a distance from the desired position that is greater than or equal to a distance between the conductor element and the connection pad; and forming a conductive layer on the receiving substrate including the integrated circuit elements thereon such that the connection pad of each of the integrated circuit elements is electrically connected to the conductive layer notwithstanding that the at least one of the integrated circuit elements is misaligned on the receiving substrate, wherein each of the integrated circuit elements includes an insulating layer on the chiplet substrate that exposes at least a portion of the connection pad to the conductive layer and covers the conductor element on the surface of each chiplet substrate to electrically separate the conductor element from the conductive layer, wherein the connection pad of each of the integrated circuit elements is coupled to an active element therein such that the conductive layer provides an electrical connection between respective active elements of each chiplet substrate, and wherein the conductor element of each of the integrated circuit elements provides an electrical connection between respective active elements of a same chiplet substrate, and wherein each chiplet substrate includes a plurality of connection pads and a plurality of conductor elements, and wherein at least one of the conductor elements is provided between adjacent ones of the connection pads on the surface of each chiplet substrate.

9. A method of assembling integrated circuit elements on a substrate, the method comprising:

providing integrated circuit elements on a receiving substrate, each of the integrated circuit elements comprising a chiplet substrate including a connection pad and a conductor element on a surface thereof, wherein the connection pad and the conductor element are electrically separated, and wherein at least one of the integrated circuit elements is misaligned on the receiving substrate relative to a desired position thereon such that the at least one of the integrated circuit elements is positioned on the receiving substrate at a distance from the desired position that is greater than or equal to a distance between the conductor element and the connection pad; and forming a conductive layer on the receiving substrate including the integrated circuit elements thereon such that the connection pad of each of the integrated circuit elements is electrically connected to the conductive layer notwithstanding that the at least one of the integrated circuit elements is misaligned on the receiving substrate, wherein each of the integrated circuit elements includes an insulating layer on the chiplet substrate that exposes at least a portion of the connection pad to the conductive layer and covers the conductor element on the surface of each chiplet substrate to electrically separate the conductor element from the conductive layer, wherein providing the integrated circuit elements on the receiving substrate comprises:

forming the integrated circuit elements including a plurality of active elements on a source substrate; and transferring the integrated circuit elements from the source substrate to the receiving substrate such that the at least one of the integrated circuit elements is misaligned on the receiving substrate relative to the desired position, and wherein the source substrate includes a sacrificial layer thereon between the integrated circuit elements and the source substrate, and wherein transferring the integrated circuit elements comprises:

separating the integrated circuit elements from one another on the source substrate to define tethers attaching the integrated circuit elements to respective anchor areas on the source substrate; and etching the sacrificial layer to release the integrated circuit elements from the source substrate without releasing the anchor areas therefrom.

10. The method of claim 9, wherein transferring further comprises:

pressing a stamp against the source substrate to break the tethers attaching the integrated circuit elements to the respective anchor areas;

retracting the stamp from the source substrate such that the integrated circuit elements are adhered to the stamp;

pressing the stamp including the integrated circuit elements thereon against the receiving substrate; and retracting the stamp from the receiving substrate to delaminate the integrated circuit elements therefrom and such that the at least one of the integrated circuit elements is misaligned on the receiving substrate relative to the desired position.

11. The method of claim 9, further comprising:

forming a protective layer on the integrated circuit elements prior to separating and/or etching, the protective layer comprising a silicon dioxide layer and an amorphous silicon layer thereon.

12. A method of assembling integrated circuit elements on a substrate, the method comprising:

providing integrated circuit elements on a receiving substrate, each of the integrated circuit elements comprising a chiplet substrate including a connection pad and a conductor element on a surface thereof, wherein the connection pad and the conductor element are electrically separated, and wherein at least one of the integrated circuit elements is misaligned on the receiving substrate relative to a desired position thereon such that the at least one of the integrated circuit elements is positioned on the receiving substrate at a distance from the desired position that is greater than or equal to a distance between the conductor element and the connection pad;

forming a conductive layer on the receiving substrate including the integrated circuit elements thereon such that the connection pad of each of the integrated circuit elements is electrically connected to the conductive layer notwithstanding that the at least one of the integrated circuit elements is misaligned on the receiving substrate;

forming a sacrificial layer on a source substrate;

forming a chiplet substrate layer on the sacrificial layer;

forming active elements on or in the chiplet substrate layer;

forming the connection pad of each of the integrated circuit elements on a surface of the chiplet substrate layer;

forming chiplet wires on or in the chiplet substrate electrically connecting the active elements and the connection pad;

forming the conductor element of each of the integrated circuit elements electrically separate from the connection pad of each of the integrated circuit elements on the surface of the chiplet substrate layer, the conductor element of each of the integrated circuit elements electrically connected to a chiplet wire or active element;

forming an insulating layer over the chiplet substrate and the conductor element of each of the integrated circuit elements, leaving at least a portion of the connection pad of each of the integrated circuit elements exposed; and patterning the chiplet substrate layer and the sacrificial layer to form the chiplet substrate of each of the integrated circuit elements detached from the source substrate.

13. The method of claim 12, further comprising:

forming a protective layer on the insulating layer and the connection pad of each of the integrated circuit elements.

14. The method of claim 13, wherein the protective layer is a bi-layer, each layer of the bi-layer comprising a different material.

15. The method of claim 14, wherein the protective bi-layer includes a silicon dioxide layer and an amorphous silicon layer.

16. The method of claim 12, further comprising:

forming one or more test pads, a plurality of electrically conductive tethers, and anchors on the source substrate, each anchor located over and in contact with the patterned sacrificial layer and having a tether connecting the anchor to one of the chiplet substrates, wherein the tether electrically connects the active elements in the one of the chiplet substrates to one or more exposed electrical test pads in the anchor.

* * * * *